(12) United States Patent
Uetani

(10) Patent No.: US 8,298,686 B2
(45) Date of Patent: Oct. 30, 2012

(54) COMPOSITION AND ORGANIC PHOTOELECTRIC CONVERTER USING THE SAME

(75) Inventor: Yasunori Uetani, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 124 days.

(21) Appl. No.: 12/867,799

(22) PCT Filed: Feb. 17, 2009

(86) PCT No.: PCT/JP2009/053126
§ 371 (c)(1),
(2), (4) Date: Aug. 16, 2010

(87) PCT Pub. No.: WO2009/104781
PCT Pub. Date: Aug. 27, 2009

(65) Prior Publication Data
US 2010/0327271 A1 Dec. 30, 2010

(30) Foreign Application Priority Data

Feb. 18, 2008 (JP) .............................. 2008-035579
Mar. 3, 2008 (JP) .............................. 2008-051810
Aug. 22, 2008 (JP) .............................. 2008-213692

(51) Int. Cl.
*H01L 51/54* (2006.01)

(52) U.S. Cl. ...................................... 428/690; 257/40

(58) Field of Classification Search .................... 257/40; 428/690–693, 917
See application file for complete search history.

(56) References Cited

U.S. PATENT DOCUMENTS

| | | | |
|---|---|---|---|
| 6,353,083 B1 | 3/2002 | Inbasekaran et al. | |
| 7,037,599 B2 * | 5/2006 | Culligan et al. | 428/690 |
| 7,112,649 B2 * | 9/2006 | Liu et al. | 528/373 |
| 7,180,110 B2 | 2/2007 | Komatsu et al. | |
| 7,605,225 B2 * | 10/2009 | Marks et al. | 528/377 |
| 7,893,160 B2 * | 2/2011 | Inbasekaran et al. | 525/191 |
| 7,910,684 B2 * | 3/2011 | Li | 528/163 |
| 8,039,121 B2 * | 10/2011 | Iwakuma et al. | 428/690 |
| 2003/0064174 A1 | 4/2003 | Miteva et al. | |
| 2003/0066950 A1 | 4/2003 | Halls et al. | |
| 2004/0115473 A1 | 6/2004 | Burroughes et al. | |
| 2006/0174937 A1 | 8/2006 | Zhou | |
| 2008/0003422 A1 | 1/2008 | Ueda | |
| 2010/0001263 A1 | 1/2010 | Noguchi et al. | |
| 2010/0006154 A1 | 1/2010 | Kitazawa et al. | |
| 2010/0033085 A1 | 2/2010 | Nakatani et al. | |
| 2010/0096980 A1 | 4/2010 | Nakatani et al. | |
| 2010/0108993 A1 | 5/2010 | Moriwaki et al. | |

FOREIGN PATENT DOCUMENTS

| | | |
|---|---|---|
| JP | 2002-536492 A | 10/2002 |
| JP | 2003-176420 A | 6/2003 |
| JP | 2004-534863 A | 11/2004 |
| JP | 2004-362910 A | 12/2004 |
| JP | 2006-063334 A | 3/2006 |
| JP | 2006-222429 A | 8/2006 |
| JP | 2008-266307 A | 11/2008 |
| JP | 2008-266459 A | 11/2008 |
| WO | 2008/016091 A1 | 2/2008 |
| WO | 2008/044585 A1 | 4/2008 |
| WO | 2008/093822 A1 | 8/2008 |
| WO | 2008/093823 A1 | 8/2008 |
| WO | 2008/093831 A1 | 8/2008 |

OTHER PUBLICATIONS

Youngkyoo Kim, et al., Organic Photovoltaic Devices Based on Blends of Regioregular Poly(3-hexylthiophene) and Poly(9,9-dioctylfluorene-co-benzothiadiazole), Chemistry of Materials, vol. 16, No. 3, Nov. 1, 2004, pp. 4812-4818.

O. Inganäs, et al., "Low bandgap alternating polyfluorene copolymers in plastic photodiodes and solar cells", Applied Physics A: Materials Science & Processing, vol. 79, No. 1, Jun. 1, 2004, pp. 31-35.

Extended European Search Report issued Mar. 29, 2012 in European Patent Application No. 09713439.9.

Christopher R. McNeill, et al., "Dual electron donor/electron acceptor character of a conjugated polymer in efficient photovoltaic diodes", Applied Physics Letters, vol. 90, No. 19, May 9, 2007, pp. 193506-1-193506-3.

* cited by examiner

*Primary Examiner* — Nathan Ha
(74) *Attorney, Agent, or Firm* — Sughrue Mion, PLLC

(57) ABSTRACT

An organic photoelectric converter having excellent photoelectric conversion efficiency can be produced by using a composition containing a polymer compound A having a repeating unit represented by formula (1) and a polymer compound B having a repeating unit represented by formula (2):

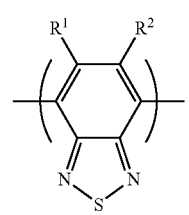

(1)

wherein $R^1$ and $R^2$ respectively represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group,

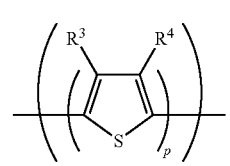
(2)

wherein $R^3$ and $R^4$ respectively represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and p represents an integer of 2 to 10.

14 Claims, No Drawings

COMPOSITION AND ORGANIC PHOTOELECTRIC CONVERTER USING THE SAME

CROSS REFERENCE TO RELATED APPLICATIONS

This application is a National Stage of International Application No. PCT/JP2009/053126 filed Feb. 17, 2009, which claims priority from Japanese Patent Application Nos. 2008-035579, 2008-051810 and 2008-213692, filed on Feb. 18, 2008, Mar. 3, 2008 and Aug. 22, 2008, respectively, the contents of all of which are incorporated herein by reference in their entirety.

TECHNICAL FIELD

The present invention relates to a composition, and an organic photoelectric converter using the same.

BACKGROUND ART

Recently, the use of an organic semiconductor material as a material of an active layer of an organic photoelectric converter (organic solar battery, optical sensor, etc.) has been intensively studied. Since an active layer can be made by an inexpensive coating method when a polymer compound is used as an organic semiconductor material, various polymer compounds and compositions containing the polymer compounds have been studied. For example, it is described that a composition including a fullerene derivative and a copolymer containing a repeating unit (M) shown below and a repeating unit (N) shown below is used for an organic solar battery (Applied Physics Letters Vol. 84, No. 10 1653-1655 (2004)).

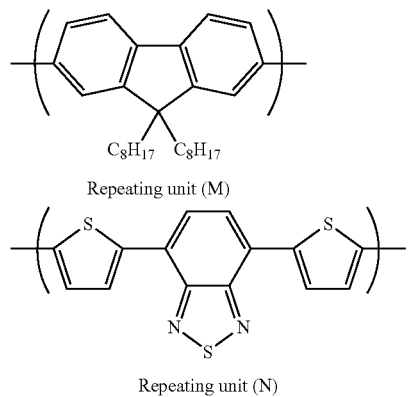

Repeating unit (M)

Repeating unit (N)

DISCLOSURE OF THE INVENTION

However, an organic photoelectric converter using the composition, such as an organic solar battery, was not necessarily sufficient in photoelectric conversion efficiency.

An object of the present invention is to provide a composition which can impart excellent photoelectric conversion efficiency to an organic photoelectric converter when used in the production of the converter.

First, the present invention provides a composition comprising a polymer compound A containing a repeating unit represented by the formula (1) and a polymer compound B containing a repeating unit represented by the formula (2):

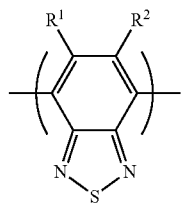

(1)

wherein $R^1$ and $R^2$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and the hydrogen atom contained in these groups may be substituted with a fluorine atom, and

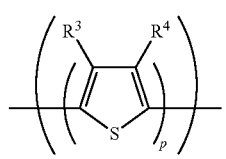

(2)

wherein $R^3$ and $R^4$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and the hydrogen atom contained in these groups may be substituted with a fluorine atom; p represents an integer of 2 to 10; a plurality of $R^3$'s may be the same or different; and a plurality of $R^4$'s may be the same or different.

Second, the present invention provides an organic photoelectric converter comprising an organic layer containing the composition of the present invention.

Third, the present invention provides an organic photoelectric converter comprising a pair of electrodes, at least one of which is transparent or translucent; a first organic layer containing the composition of the present invention provided between the electrodes; and a second organic layer containing an electron-donating compound provided adjacent to the first organic layer.

Fourth, the present invention provides an organic photoelectric converter comprising a pair of electrodes, at least one of which is transparent or translucent; a first organic layer containing an electron-accepting compound provided between the electrodes; and a second organic layer containing the composition of the present invention provided adjacent to the first organic layer.

Fifth, the present invention provides an organic photoelectric converter comprising a pair of electrodes, at least one of which is transparent or translucent; and an organic layer containing the composition of the present invention and an electron-donating compound provided between the electrodes.

Sixth, the present invention provides an organic photoelectric converter comprising a pair of electrodes, at least one of which is transparent or translucent; and an organic layer containing an electron-accepting compound and the composition of the present invention provided between the electrodes.

MODE FOR CARRYING OUT THE INVENTION

The present invention will be described in detail below.

The composition of the present invention comprises a polymer compound A containing a repeating unit represented by the formula (1) and a polymer compound B containing a repeating unit represented by the formula (2).

<Polymer Compound A>

In the polymer compound A used in the present invention, $R^1$ and $R^2$ in the formula (1) each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and the hydrogen atom contained in these groups may be substituted with a fluorine atom.

In the formula (1), the alkyl group represented by $R^1$ and $R^2$ may be linear or branched, or a cycloalkyl group. The alkyl group usually has about 1 to 20 carbon atoms, and examples thereof include a methyl group, an ethyl group, a n-propyl group, an i-propyl group, a n-butyl group, an i-butyl group, a t-butyl group, a s-butyl group, a 3-methylbutyl group, a n-pentyl group, a n-hexyl group, a 2-ethylhexyl group, a n-heptyl group, a n-octyl group, a n-nonyl group, a n-decyl group, a 3,7-dimethyloctyl group and a n-lauryl group. The hydrogen atom in the alkyl group may be substituted with a fluorine atom. Examples of the alkyl group substituted with a fluorine atom include a trifluoromethyl group, a pentafluoroethyl group, a perfluorobutyl group, a perfluorohexyl group and a perfluorooctyl group.

In the formula (1), the alkoxy group represented by $R^1$ and $R^2$ may be linear or branched, or a cycloalkyloxy group. The alkoxy group usually has about 1 to 20 carbon atoms, and examples thereof include a methoxy group, an ethoxy group, a n-propyloxy group, an i-propyloxy group, a n-butoxy group, an i-butoxy group, a s-butoxy group, a t-butoxy group, a n-pentyloxy group, a n-hexyloxy group, a cyclohexyloxy group, a n-heptyloxy group, a n-octyloxy group, a 2-ethylhexyloxy group, a n-nonyloxy group, a n-decyloxy group, a 3,7-dimethyloctyloxy group and a n-lauryloxy group. The hydrogen atom in the alkoxy group may be substituted with a fluorine atom. Examples of the alkoxy group substituted with a fluorine atom include a trifluoromethoxy group, a pentafluoroethoxy group, a perfluorobutoxy group, a perfluorohexyl group and a perfluorooctyl group.

In the formula (1), the alkylthio group represented by $R^1$ and $R^2$ may be linear or branched, or a cycloalkylthio group. The alkylthio group usually has about 1 to 20 carbon atoms, and examples thereof include a methylthio group, an ethylthio group, a n-propylthio group, an isopropylthio group, a n-butylthio group, an isobutylthio group, a s-butylthio group, a t-butylthio group, a n-pentylthio group, a n-hexylthio group, a cyclohexylthio group, a n-heptylthio group, a n-octylthio group, a 2-ethylhexylthio group, a n-nonylthio group, a n-decylthio group, a 3,7-dimethyloctylthio group and a n-laurylthio group. The hydrogen atom in the alkylthio group may be substituted with a fluorine atom. Examples of the alkylthio group substituted with a fluorine atom include a trifluoromethylthio group.

In the formula (1), the aryl group represented by $R^1$ and $R^2$ is an atomic group in which one hydrogen atom has been eliminated from an aromatic hydrocarbon, and includes those having a benzene ring, those having a condensed ring, and those to which an independent benzene ring or two or more condensed rings are bonded directly or bonded via a divalent group such as vinylene. The aryl group usually has about 6 to 60 carbon atoms, and preferably 6 to 48 carbon atoms, and may have a substituent. Examples of the substituent include a linear or branched alkyl group having 1 to 20 carbon atoms or a cycloalkyl group having 1 to 20 carbon atoms, an alkoxy group containing a linear or branched alkyl group having 1 to 20 carbon atoms or a cycloalkyl group having 1 to 20 carbon atoms in a structure thereof, and a group represented by the formula (15).

$$—O—(CH_2)_g—O—(CH_2)_h—CH_3 \quad (15)$$

In the formula (15), g represents an integer of 1 to 6, and h represents an integer of 0 to 5.

Examples of the aryl group include a phenyl group, a $C_1$-$C_{12}$ alkoxyphenyl group ($C_1$-$C_{12}$ means that the number of carbon atoms is from 1 to 12, the same shall apply hereinafter), a $C_1$-$C_{12}$ alkylphenyl group, a 1-naphthyl group, a 2-naphthyl group, a 1-anthracenyl group, a 2-anthracenyl group, a 9-anthracenyl group and a pentafluorophenyl group, and a $C_1$-$C_{12}$ alkoxyphenyl group and a $C_1$-$C_{12}$ alkylphenyl group are preferable. Examples of the $C_1$-$C_{12}$ alkoxyphenyl group include a methoxyphenyl group, an ethoxyphenyl group, a n-propyloxyphenyl group, an isopropyloxyphenyl group, a n-butoxyphenyl group, an isobutoxyphenyl group, a s-butoxyphenyl group, a t-butoxyphenyl group, a n-pentyloxyphenyl group, a n-hexyloxyphenyl group, a cyclohexyloxyphenyl group, a n-heptyloxyphenyl group, a n-octyloxyphenyl group, a 2-ethylhexyloxyphenyl group, a n-nonyloxyphenyl group, a n-decyloxyphenyl group, a 3,7-dimethyloctyloxyphenyl group and a n-lauryloxyphenyl group. Examples of the $C_1$-$C_{12}$ alkylphenyl group include a methylphenyl group, an ethylphenyl group, a dimethylphenyl group, a n-propylphenyl group, a mesityl group, a methylethylphenyl group, an isopropylphenyl group, a n-butylphenyl group, an isobutylphenyl group, a s-butylphenyl group, a t-butylphenyl group, a n-pentylphenyl group, an isoamylphenyl group, a hexylphenyl group, a n-heptylphenyl group, a n-octylphenyl group, a n-nonylphenyl group, a n-decylphenyl group and a n-dodecylphenyl group. The hydrogen atom in the aryl group may be substituted with a fluorine atom.

In the formula (1), the aryloxy group represented by $R^1$ and $R^2$ usually has about 6 to 60 carbon atoms, and preferably 6 to 48 carbon atoms. Examples of the aryloxy group include a phenoxy group, a $C_1$-$C_{12}$ alkoxyphenoxy group, a $C_1$-$C_{12}$ alkylphenoxy group, a 1-naphthyloxy group, a 2-naphthyloxy group and a pentafluorophenyloxy group, and a $C_1$-$C_{12}$ alkoxyphenoxy group and a $C_1$-$C_{12}$ alkylphenoxy group are preferable. Examples of the $C_1$-$C_{12}$ alkoxy include methoxy, ethoxy, n-propyloxy, isopropyloxy, n-butoxy, isobutoxy, s-butoxy, t-butoxy, n-pentyloxy, n-hexyloxy, cyclohexyloxy, n-heptyloxy, n-octyloxy, 2-ethylhexyloxy, n-nonyloxy, n-decyloxy, 3,7-dimethyloctyloxy and n-lauryloxy. Examples of the $C_1$-$C_{12}$ alkylphenoxy group include a methylphenoxy group, an ethylphenoxy group, a dimethylphenoxy group, a n-propylphenoxy group, a 1,3,5-trimethylphenoxy group, a methylethylphenoxy group, an isopropylphenoxy group, a n-butylphenoxy group, an isobutylphenoxy group, a s-butylphenoxy group, a t-butylphenoxy group, a n-pentylphenoxy group, an isoamylphenoxy group, a n-hexylphenoxy group, a n-heptylphenoxy group, a n-octylphenoxy group, a n-nonylphenoxy group, a n-decylphenoxy group and a n-dodecylphenoxy group.

In the formula (1), the arylthio group represented by $R^1$ and $R^2$ may have a substituent on an aromatic ring and usually has about 6 to 60 carbon atoms, and examples of the arylthio group include a phenylthio group, a $C_1$-$C_{12}$ alkoxyphenylthio group, a $C_1$-$C_{12}$ alkylphenylthio group, a 1-naphthylthio group, a 2-naphthylthio group, a pentafluorophenylthio group, a pyridylthio group, a pyridazinylthio group, a pyrimidylthio group, a pyrazylthio group and a triazylthio group.

In the formula (1), the arylalkyl group represented by $R^1$ and $R^2$ may have a substituent and usually has about 7 to 60 carbon atoms, and examples of the arylalkyl group include a phenyl-$C_1$-$C_{12}$ alkyl group, a $C_1$-$C_{12}$ alkoxyphenyl-$C_1$-$C_{12}$ alkyl group, a $C_1$-$C_{12}$ alkylphenyl-$C_1$-$C_{12}$ alkyl group, a 1-naphthyl-$C_1$-$C_{12}$ alkyl group and a 2-naphthyl-$C_1$-$C_{12}$ alkyl group.

In the formula (1), the arylalkoxy group represented by $R^1$ and $R^2$ may have a substituent and usually has about 7 to 60 carbon atoms, and examples of the arylalkoxy group include a phenyl-$C_1$-$C_{12}$ alkoxy group, a $C_1$-$C_{12}$ alkoxyphenyl-$C_1$-$C_{12}$ alkoxy group, a $C_1$-$C_{12}$ alkylphenyl-$C_1$-$C_{12}$ alkoxy group, a 1-naphthyl-$C_1$-$C_{12}$ alkoxy group and a 2-naphthyl-$C_1$-$C_{12}$ alkoxy group.

In the formula (1), the arylalkylthio group represented by $R^1$ and $R^2$ may have a substituent and usually has about 7 to 60 carbon atoms, and examples of the arylalkylthio group include a phenyl-$C_1$-$C_{12}$alkylthio group, a $C_1$-$C_{12}$ alkoxyphenyl-$C_1$-$C_{12}$ alkylthio group, a $C_1$-$C_{12}$ alkylphenyl-$C_1$-$C_{12}$ alkylthio group, a 1-naphthyl-$C_1$-$C_{12}$ alkylthio group and a 2-naphthyl-$C_1$-$C_{12}$ alkylthio group.

Examples of a repeating unit represented by the formula (1) include the following repeating units.

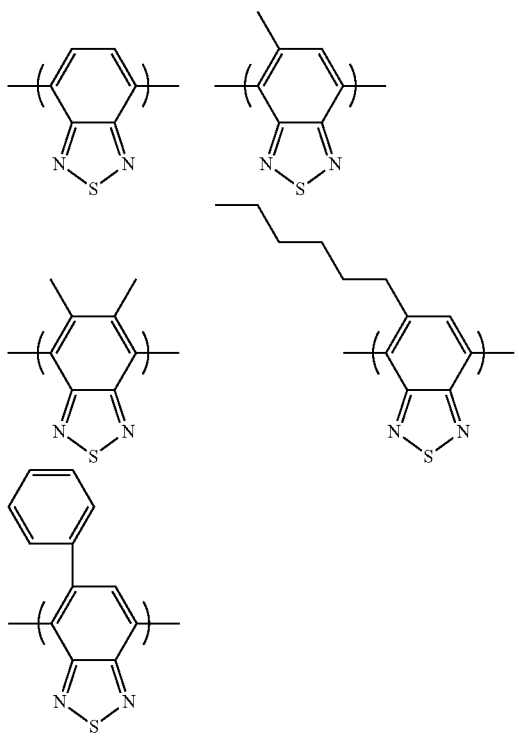

It is preferable that $R^1$ and $R^2$ represent a hydrogen atom or an alkyl group, it is more preferable that at least one of $R^1$ and $R^2$ be a hydrogen atom, and it is still more preferable that both $R^1$ and $R^2$ be hydrogen atoms.

From the viewpoint of charge transporting property, it is preferable that the polymer compound A further contain a repeating unit represented by the formula (3):

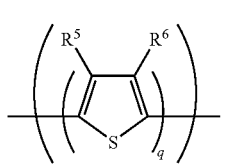

(3)

wherein $R^5$ and $R^6$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and the hydrogen atom contained in these groups may be substituted with a fluorine atom; q represents an integer of 2 to 7; a plurality of $R^5$'s may be the same or different; and a plurality of $R^6$'s may be the same or different.

In the formula (3), the definitions and specific examples of the alkyl group, the alkoxy group, the alkylthio group, the aryl group, the aryloxy group, the arylthio group, the arylalkyl group, the arylalkoxy group and the arylalkylthio group represented by $R^5$ and $R^6$ are the same as those in the above description for $R^1$.

$R^5$ is preferably a hydrogen atom or an alkyl group. Further, $R^6$ is preferably a hydrogen atom or an alkyl group.

Examples of a repeating unit represented by the formula (3) include the following repeating units.

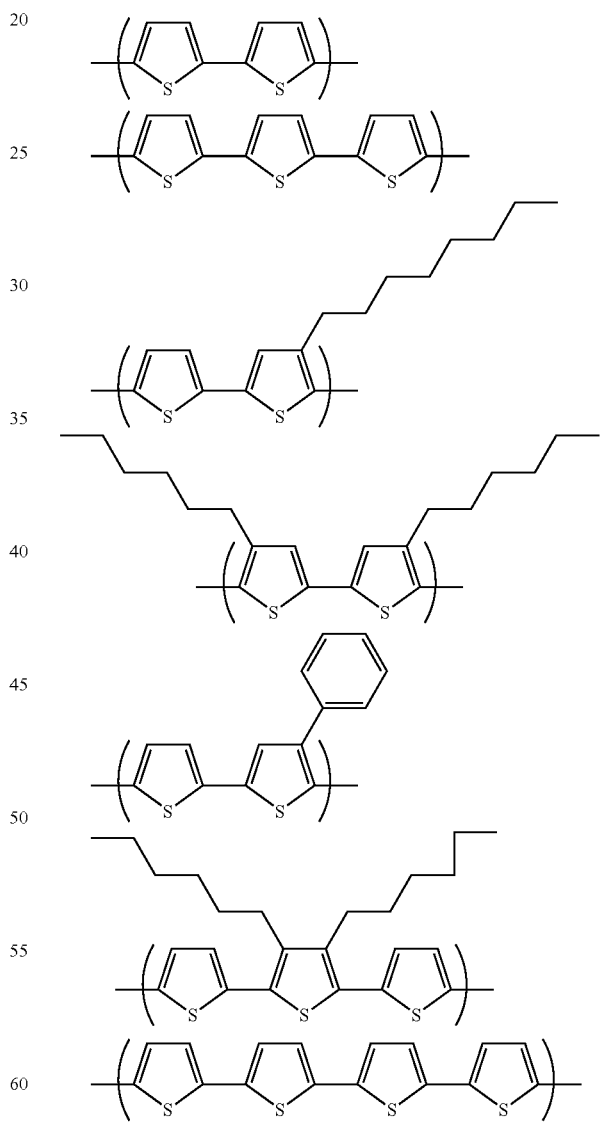

In the formula (3), q is preferably from 2 to 7, and more preferably from 3 to 5, from the viewpoint of charge transporting property.

It is preferable that the polymer compound A further contain a repeating unit represented by the formula (4) from the viewpoint of ease of increasing the polymerization degree. The repeating unit represented by the formula (1) is not contained in the repeating unit represented by the formula (4):

$$-(Ar)- \quad (4)$$

wherein Ar represents an arylene group, a divalent heterocyclic group or a divalent aromatic amine residue.

The arylene group is an atomic group in which two hydrogen atoms have been eliminated from an aromatic hydrocarbon, and includes those having a benzene ring, those having a condensed ring, and those to which an independent benzene ring or two or more condensed rings are bonded directly or bonded via a divalent group such as vinylene. The arylene group may have a substituent. Examples of the substituent include a linear or branched alkyl group having 1 to 20 carbon atoms or a cycloalkyl group having 1 to 20 carbon atoms, an alkoxy group containing a linear or branched alkyl group having 1 to 20 carbon atoms or a cycloalkyl group having 1 to 20 carbon atoms in a structure thereof. The number of carbon atoms of the moiety in which the substituent in the arylene group has been eliminated is usually from about 6 to 60, and preferably from about 6 to 20. The number of the whole carbon atoms, including the substituent of the arylene group, is usually from about 6 to 100.

Examples of the arylene group include a phenylene group, a naphthalenediyl group, an anthracene-diyl group, a biphenyl-diyl group, a terphenyl-diyl group, a fluorenediyl group and a benzofluorenediyl group.

Among the arylene groups, a group represented by the formula (6) or a group represented by the formula (7) is preferable from the viewpoint of photoelectric conversion efficiency when used in the organic photoelectric converter:

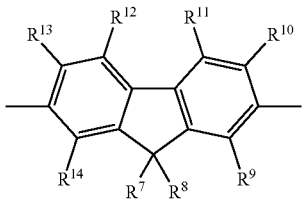

(6)

wherein $R^7$, $R^8$, $R^9$, $R^{10}$, $R^{11}$, $R^{12}$, $R^{13}$ and $R^{14}$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and the hydrogen atom contained in these groups may be substituted with a fluorine atom:

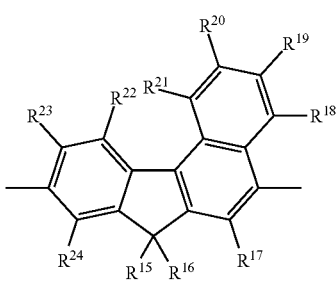

(7)

wherein $R^{15}$, $R^{16}$, $R^{17}$, $R^{18}$, $R^{19}$, $R^{20}$, $R^{21}$, $R^{22}$, $R^{23}$ and $R^{24}$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and the hydrogen atom contained in these groups may be substituted with a fluorine atom.

In the formula (6), examples of the alkyl group, the alkoxy group, the alkylthio group, the aryl group, the aryloxy group, the arylthio group, the arylalkyl group, the arylalkoxy group and the arylalkylthio group represented by $R^7$ to $R^{14}$ include the same groups as in the case of $R^1$.

From the viewpoint of solubility of the composition of the present invention in an organic solvent, it is preferable that both $R^7$ and $R^8$ in the formula (6) be alkyl groups, alkoxy groups or aryl groups, and it is preferable that both of them be alkyl groups or aryl groups.

Examples of a group represented by the formula (6) include the following groups:

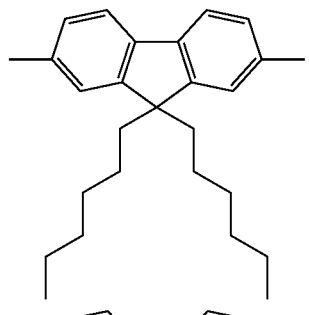

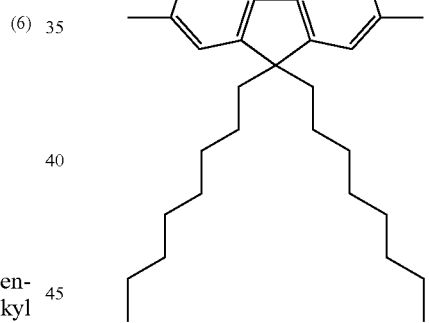

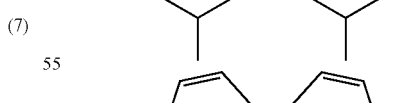

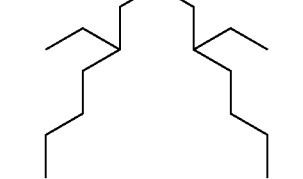

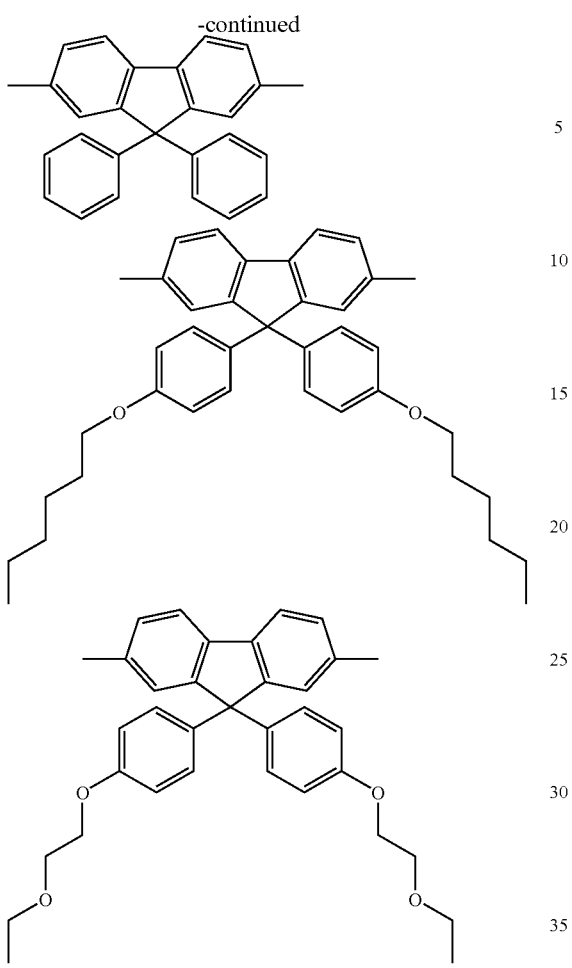

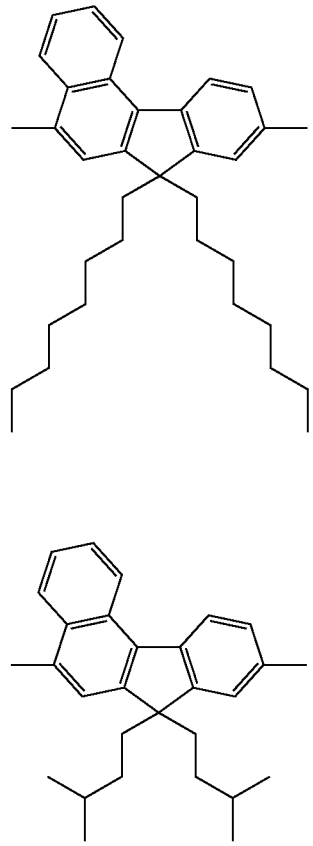

In the formula (7), examples of the alkyl group, the alkoxy group, the alkylthio group, the aryl group, the aryloxy group, the arylthio group, the arylalkyl group, the arylalkoxy group and the arylalkylthio group represented by $R^{15}$ to $R^{24}$ include the same groups as those in the case of $R^1$.

From the viewpoint of solubility of the composition of the present invention in an organic solvent, it is preferable that both $R^{15}$ and $R^{16}$ in the formula (7) be alkyl groups, alkoxy groups or aryl groups and it is more preferable that they be alkyl groups or aryl groups.

Examples of a group represented by the formula (7) include the following groups.

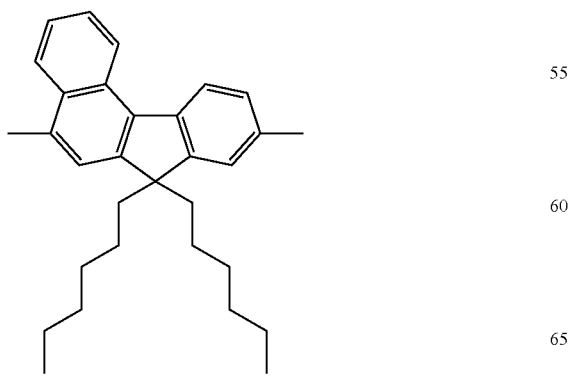

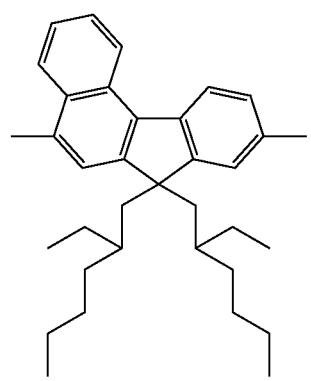

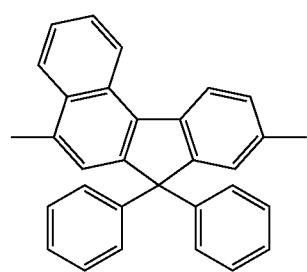

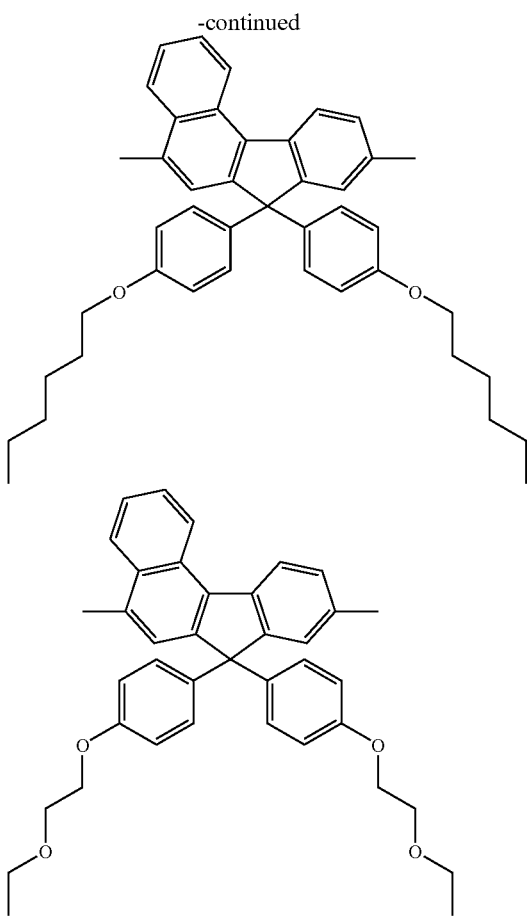

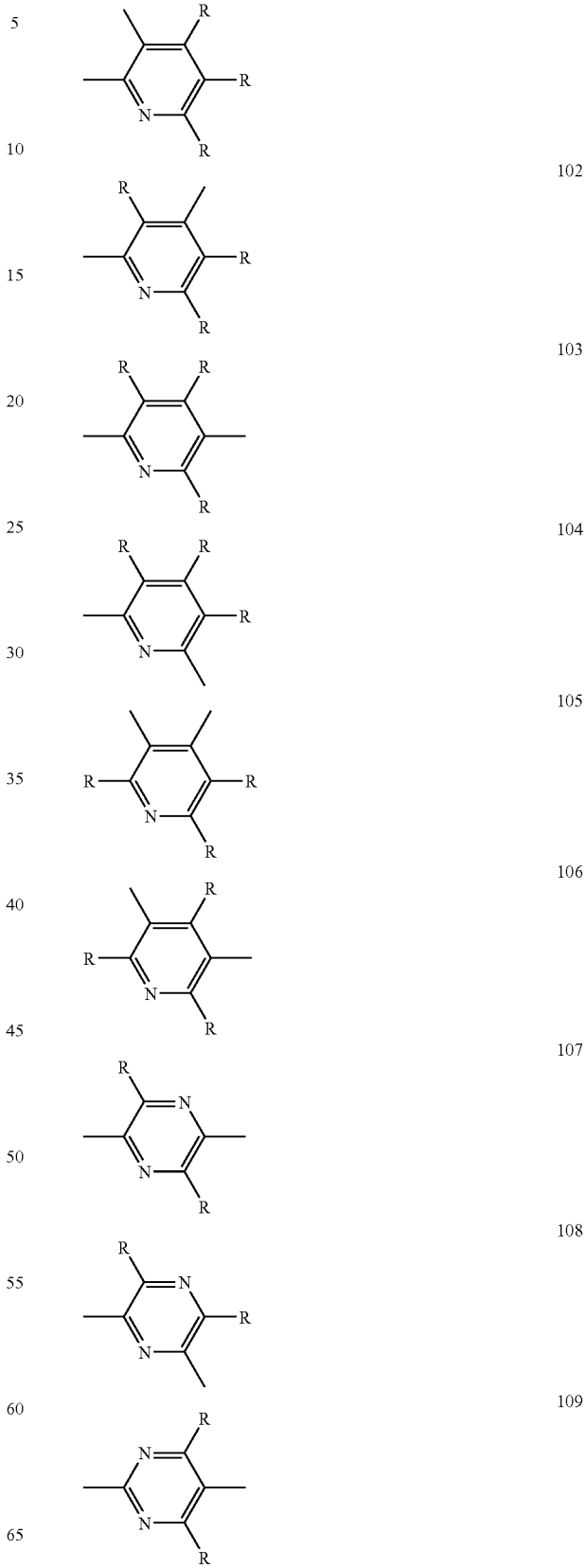

The divalent heterocyclic group means an atomic group remaining after eliminating two hydrogen atoms from a heterocyclic compound, and the group may have a substituent.

The term "heterocyclic compound" used herein means an organic compound having a cyclic structure, in which an element constituting the ring contains not only a carbon atom, but also heteroatoms such as oxygen, sulfur, nitrogen, phosphorus, boron and arsenic in the ring. Among divalent heterocyclic groups, an aromatic heterocyclic group is preferable. The number of carbon atoms of the moiety in which the substituent in the divalent heterocyclic group has been eliminated is usually from about 3 to 60. The number of the whole carbon atoms, including the substituent of the divalent heterocyclic group, is usually from about 3 to 100.

Examples of the divalent heterocyclic group include the followings:

divalent heterocyclic groups containing nitrogen as a heteroatom: pyridine-diyl groups (the formulas 101 to 106 shown below), diazaphenylene groups (the formulas 107 to 110 shown below), quinolinediyl groups (the formulas 111 to 125 shown below), quinoxalinediyl groups (the formulas 126 to 130 shown below), acridinediyl groups (the formulas 131 to 134 shown below), bipyridyldiyl groups (the formulas 135 to 137 shown below) and phenanthrolinediyl groups (the formulas 138 to 140 shown below);

five-membered ring heterocyclic groups containing oxygen, silicon, nitrogen, sulfur, selenium, boron, phosphorus or the like as a heteroatom (the formulas 141 to 145 shown below); five-membered ring condensed heterocyclic groups containing oxygen, silicon, nitrogen, selenium or the like as a heteroatom (the formulas 146 to 172 shown below); and a group represented by the formula (8):

110
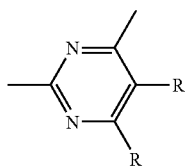
111
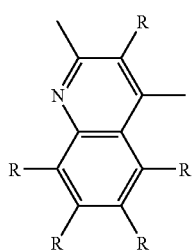
112
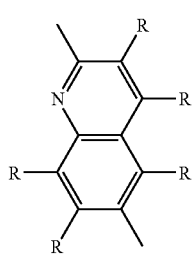
113
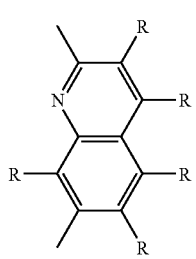
114
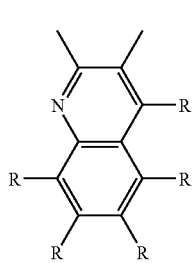
115
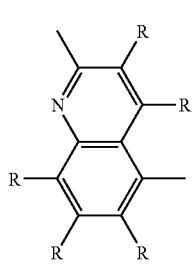
116
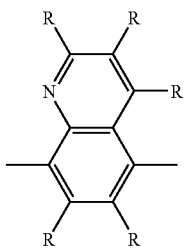
117
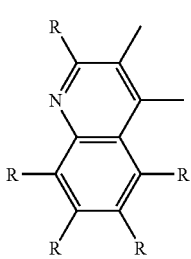
118
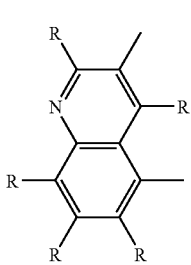
119
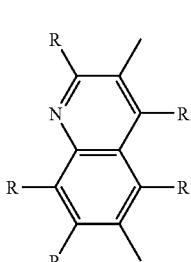
120
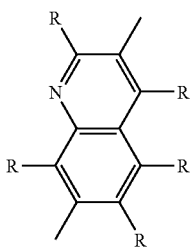
121
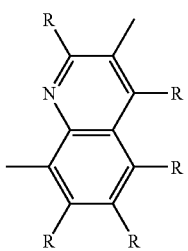

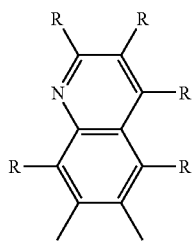
122
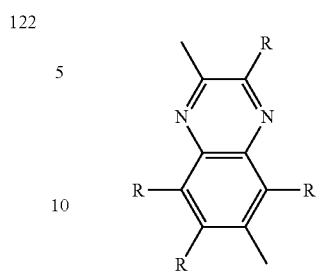
128
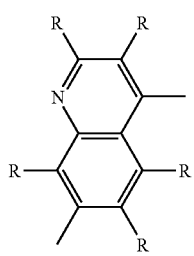
123
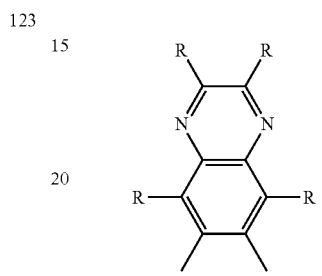
129
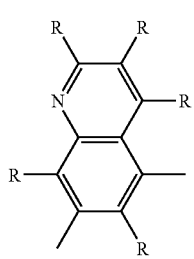
124
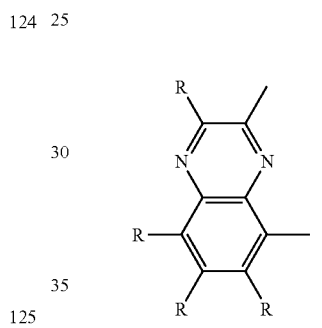
130
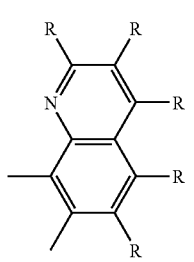
125
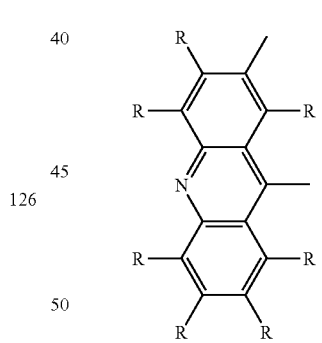
131
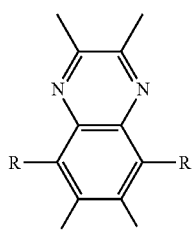
126
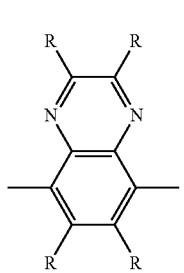
127
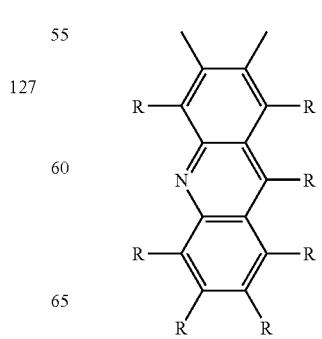
132

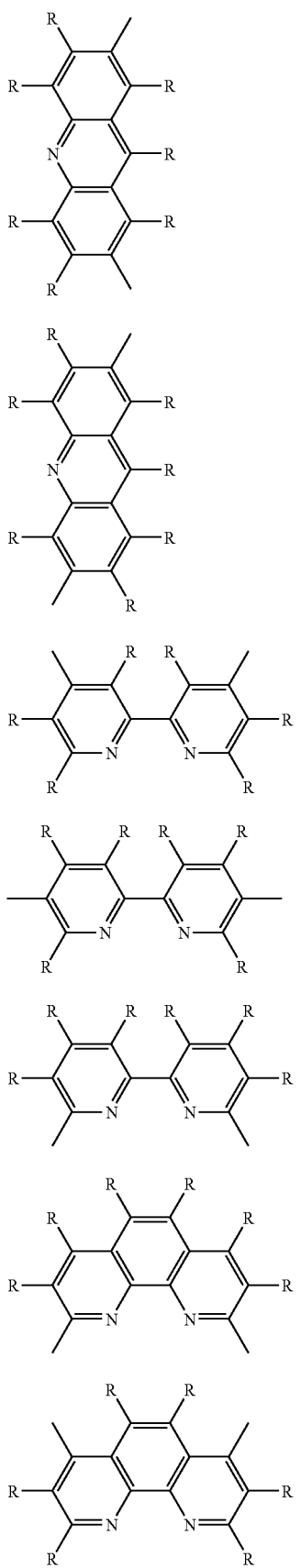
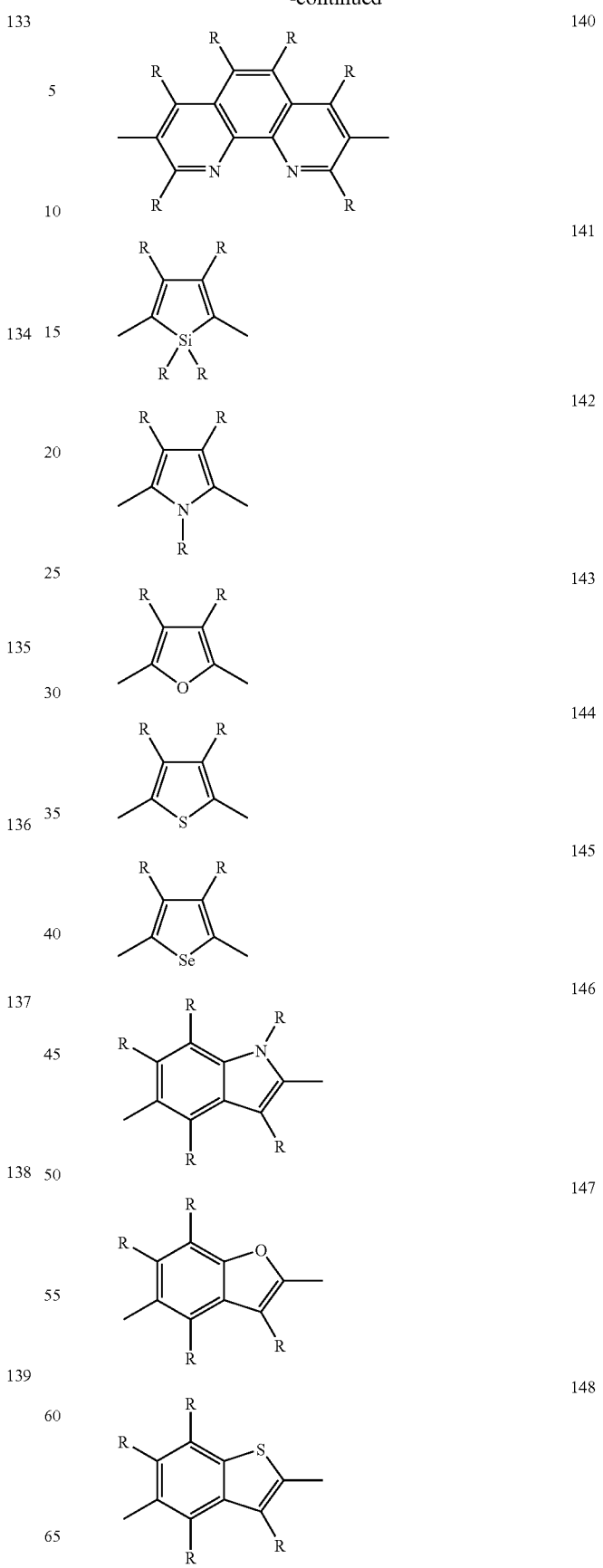

-continued
149 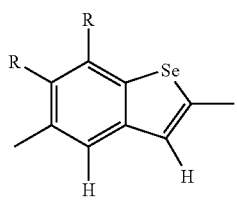
150 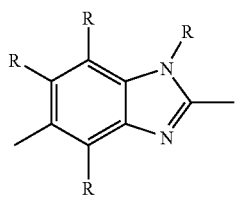
151 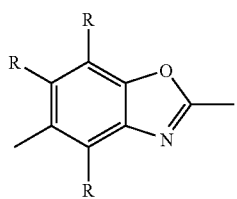
152 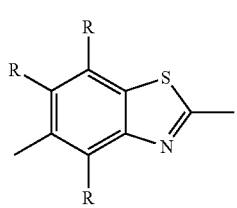
153 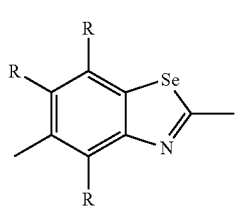
154 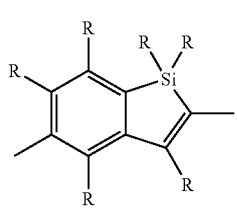
155 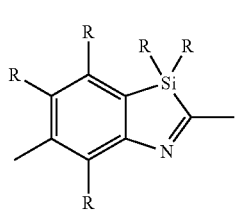
156 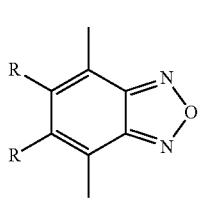
-continued
157 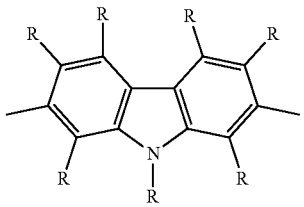
158 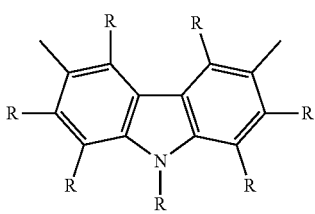
159 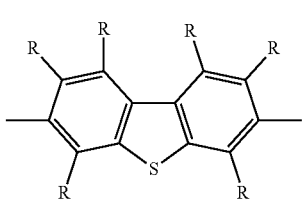
160 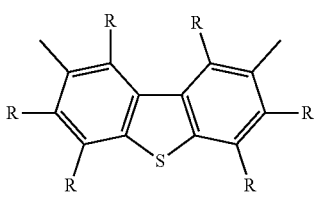
161 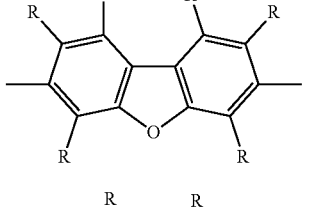
162 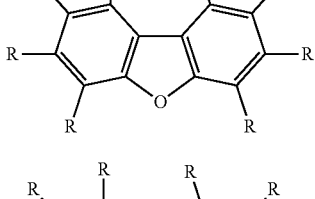
163 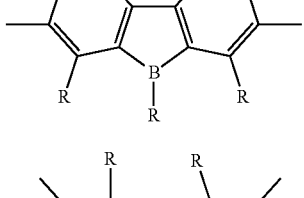
164 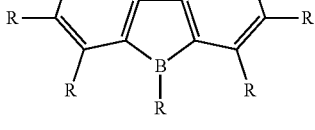

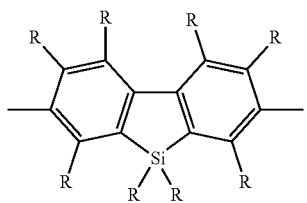
165

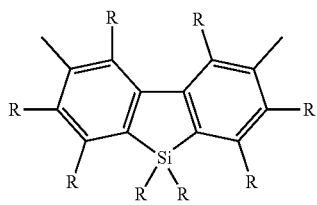
166

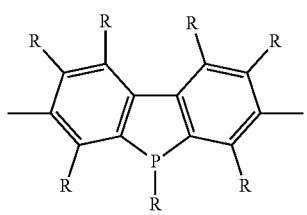
167

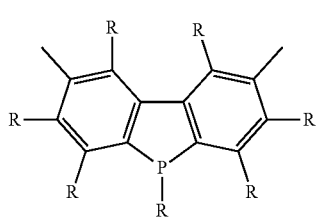
168

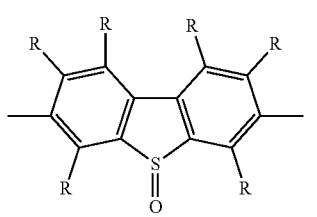
169

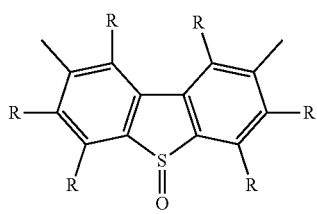
170

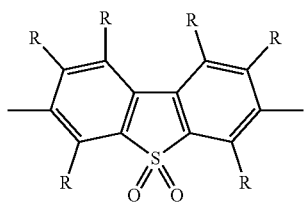
171

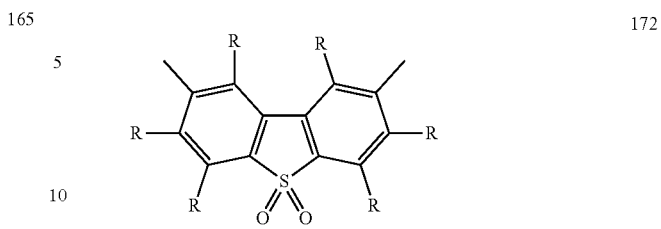
172 in the formulas 101 to 172, R represents a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, the hydrogen atom contained in these groups may be substituted with a fluorine atom, and a plurality of R's may be the same or different.

In the formulas 101 to 172, the definitions and the specific examples of the alkyl group, the alkoxy group, the alkylthio group, the aryl group, the aryloxy group, the arylthio group, the arylalkyl group, the arylalkoxy group and the arylalkylthio group represented by R are the same as those in the above description for $R^1$:

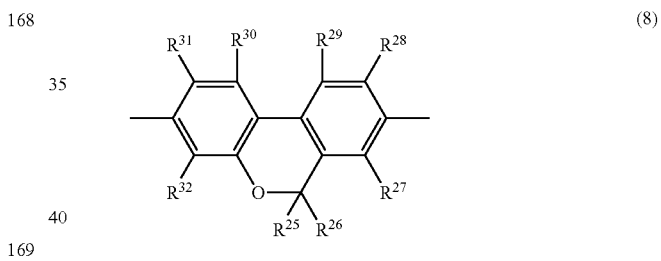
(8)

wherein $R^{25}$, $R^{26}$, $R^{27}$, $R^{28}$, $R^{29}$, $R^{30}$, $R^{31}$ and $R^{32}$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and the hydrogen atom contained in these groups may be substituted with a fluorine atom.

In the formula (8), the definitions and the specific examples of the alkyl group, the alkoxy group, the alkylthio group, the aryl group, the aryloxy group, the arylthio group, the arylalkyl group, the arylalkoxy group and the arylalkylthio group represented by $R^{25}$ to $R^{32}$ are the same as those in the above description for $R^1$.

From the viewpoint of solubility of the composition of the present invention in an organic solvent, $R^{25}$ and $R^{26}$ in the formula (8) preferably represent an alkyl group, an alkoxy group or an aryl group, and more preferably an alkyl group or an aryl group.

Examples of a group represented by the formula (8) include the following groups.

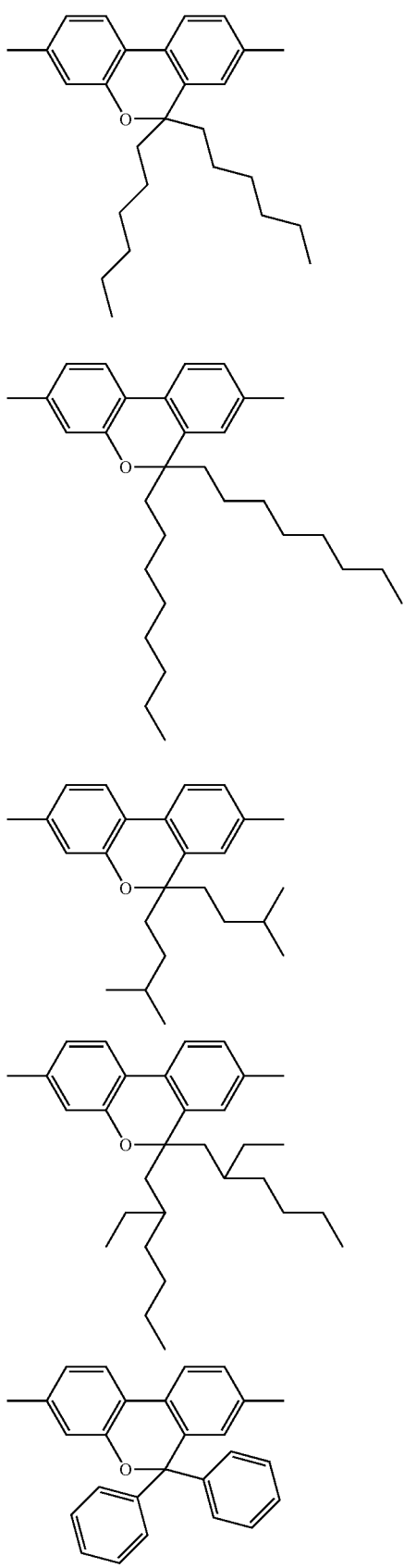
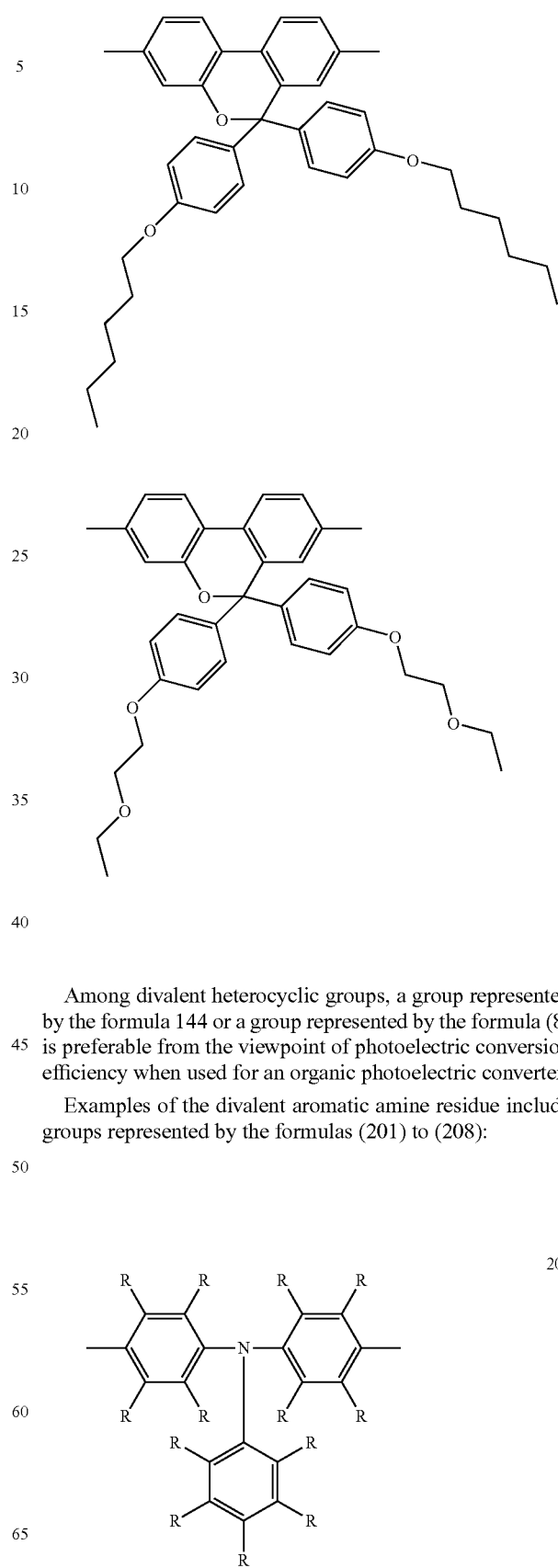
Among divalent heterocyclic groups, a group represented by the formula 144 or a group represented by the formula (8) is preferable from the viewpoint of photoelectric conversion efficiency when used for an organic photoelectric converter.
Examples of the divalent aromatic amine residue include groups represented by the formulas (201) to (208):
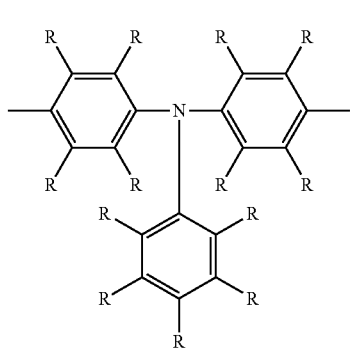
201

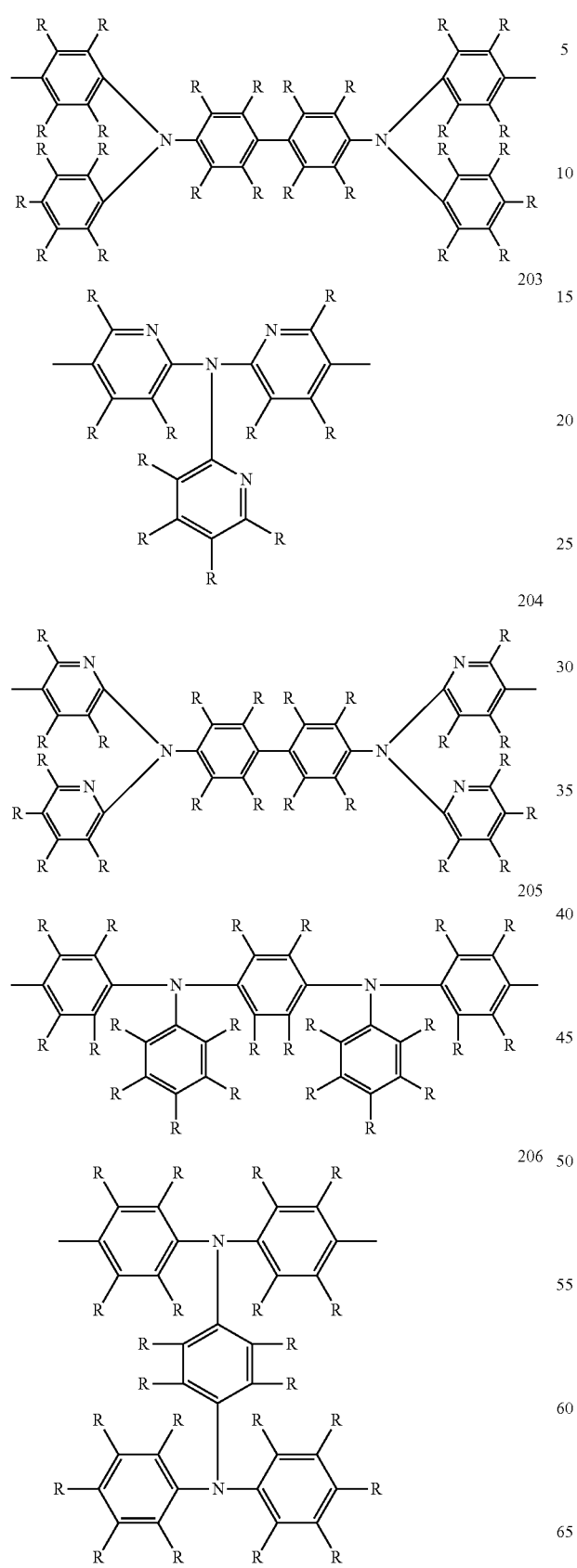
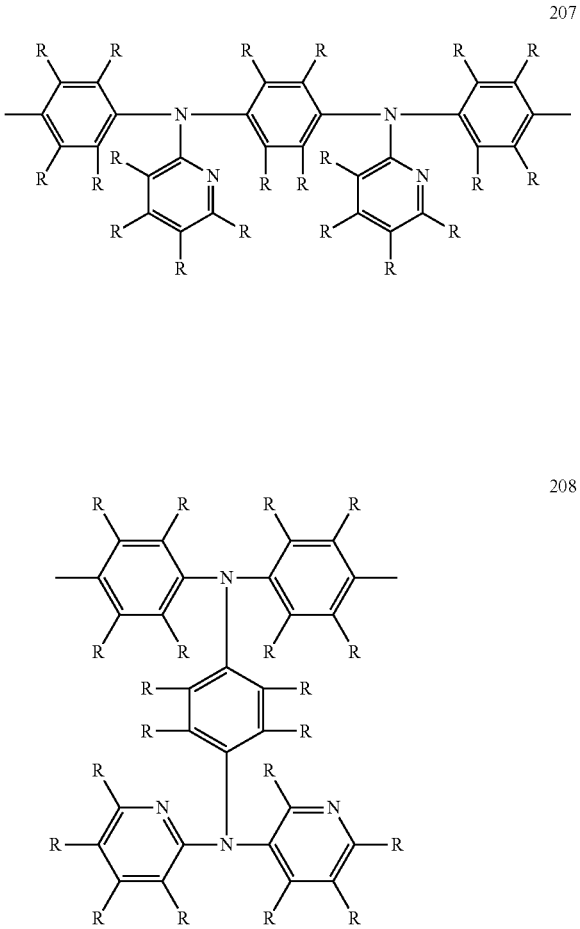

in the formulas 201 to 208, R has the same meaning as defined above.

The polymer compound A may contain two or more kinds of repeating units represented by the formula (4).

A group represented by the formula (6), a group represented by the formula (7), a group represented by the formula (8) or a group represented by the formula 144 is preferable for Ar.

Examples of preferable repeating unit contained in the polymer compound A include the following repeating units.

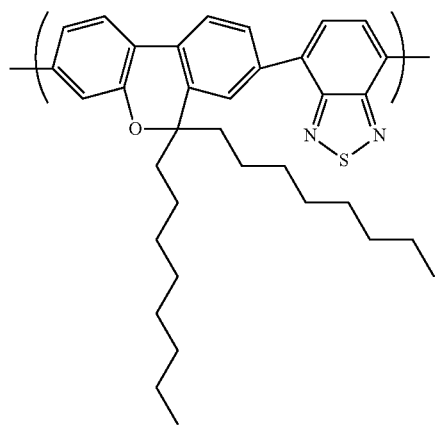
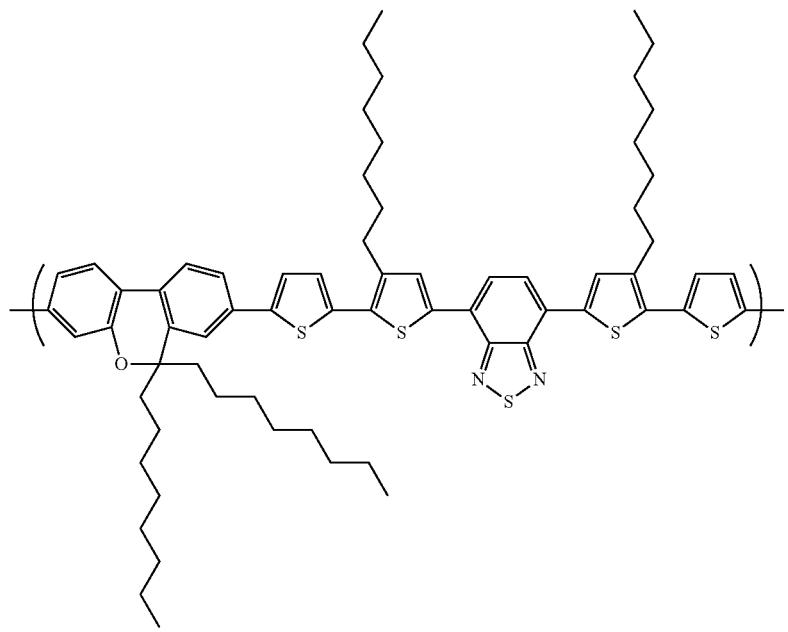
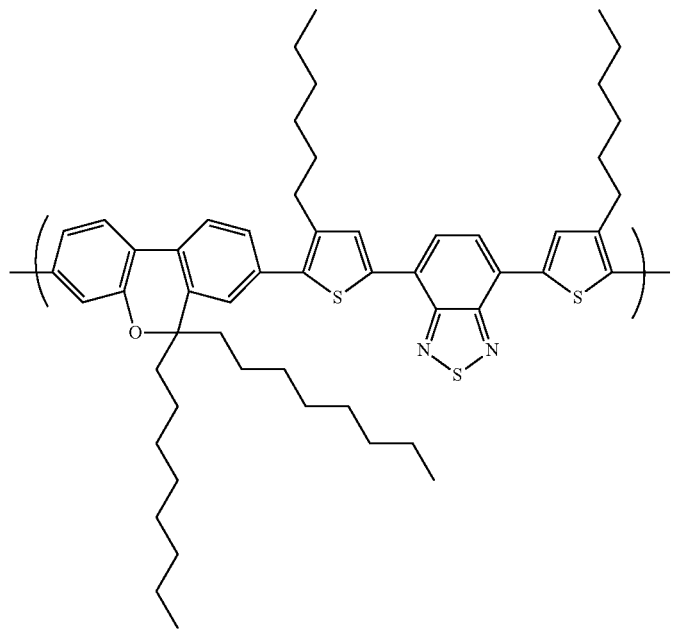

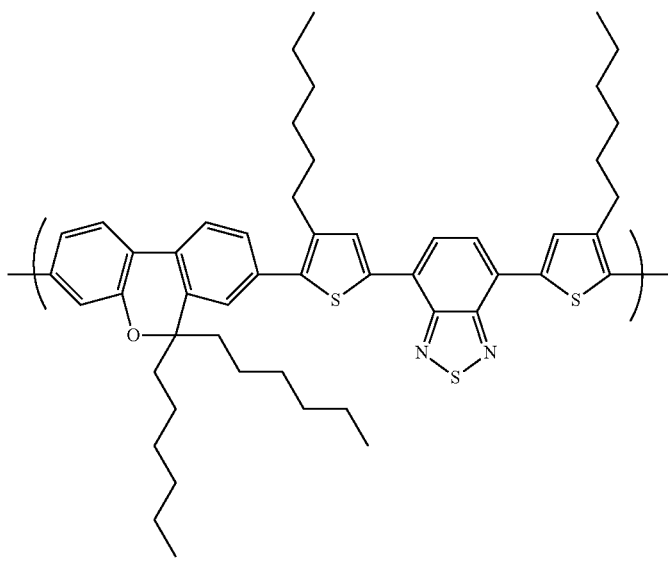
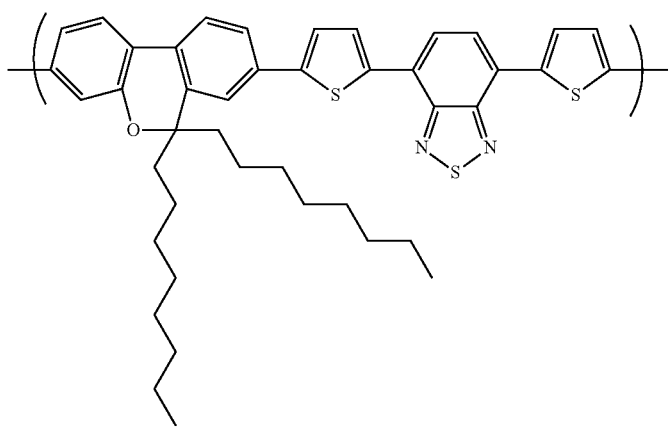
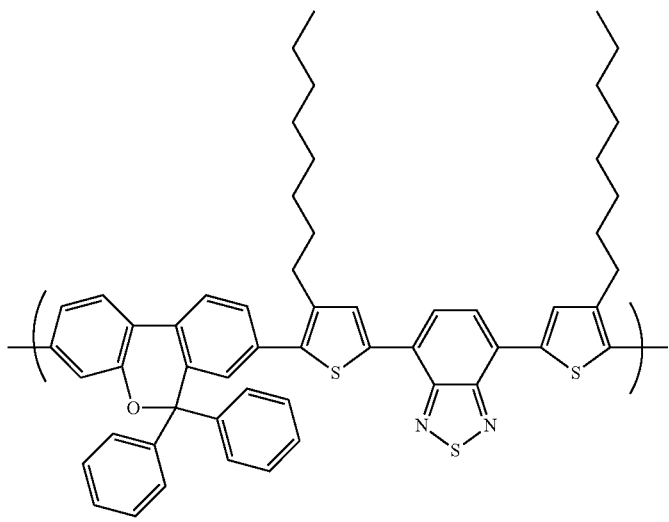

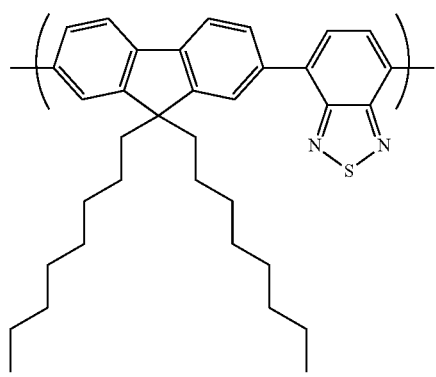
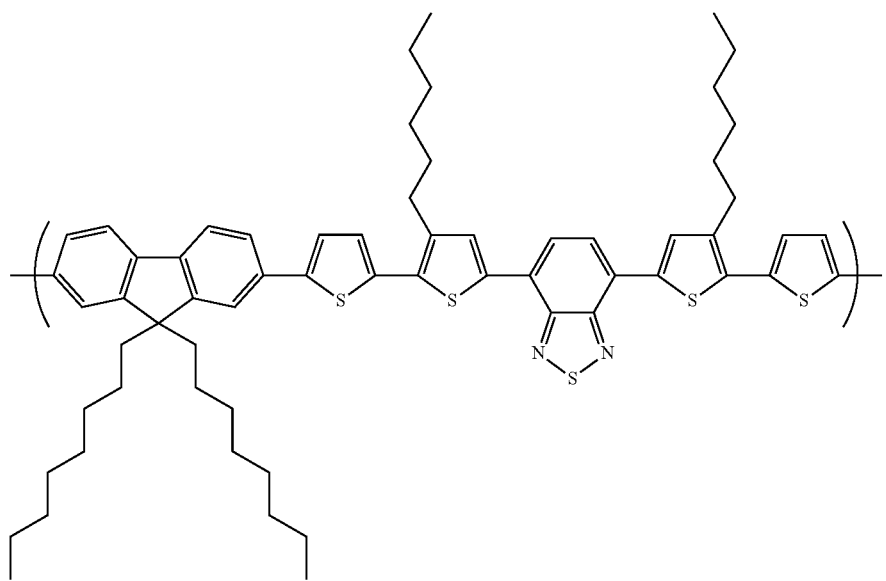
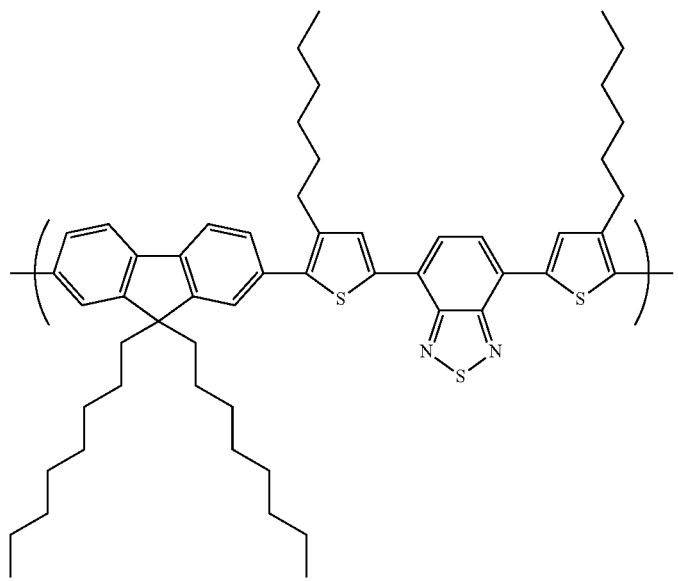

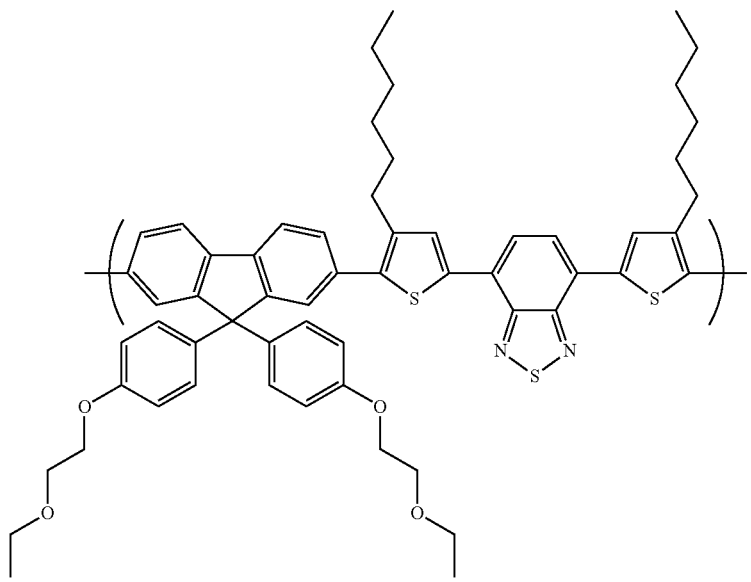
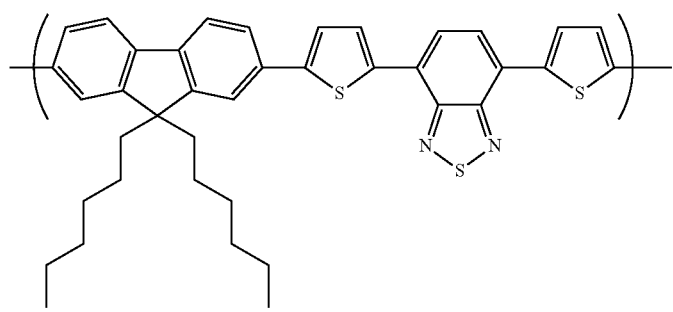
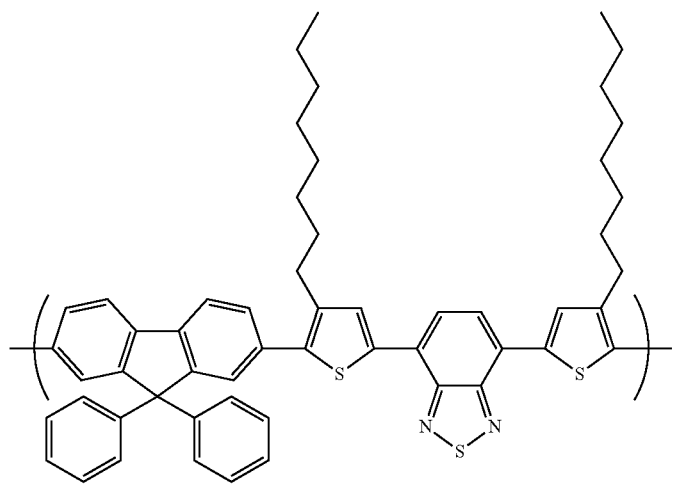

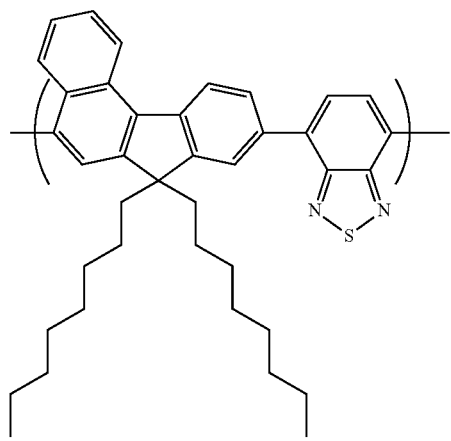
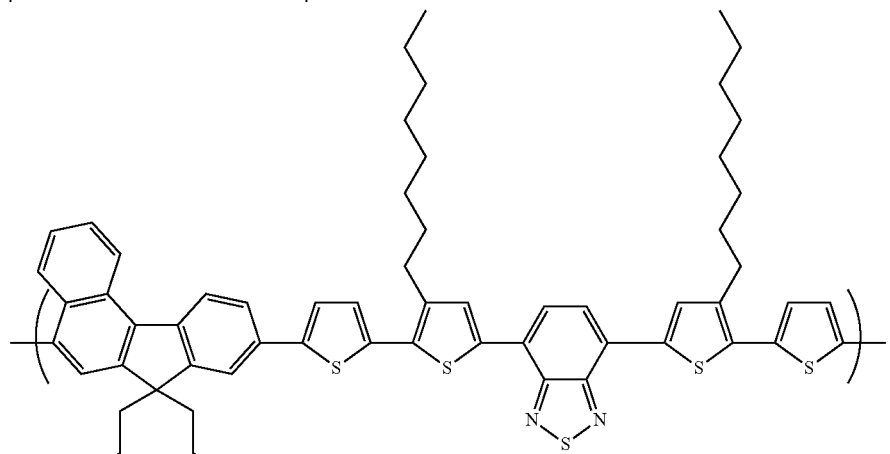
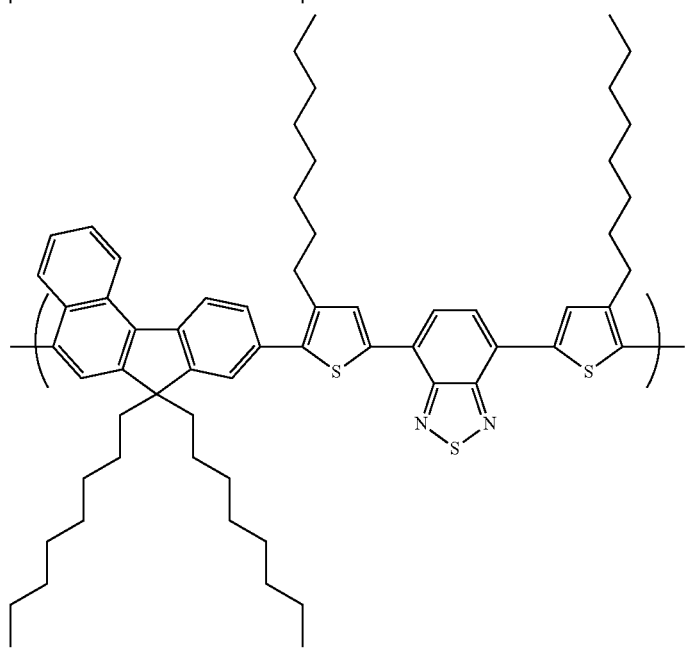

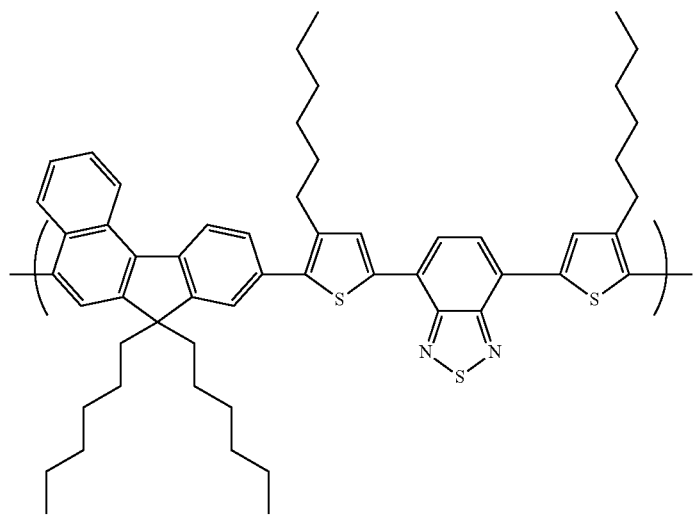
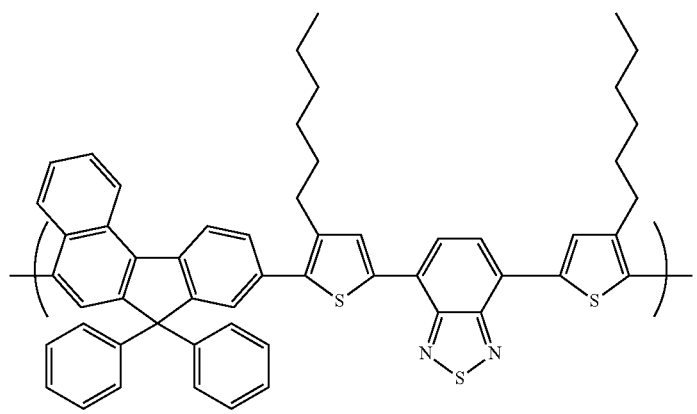
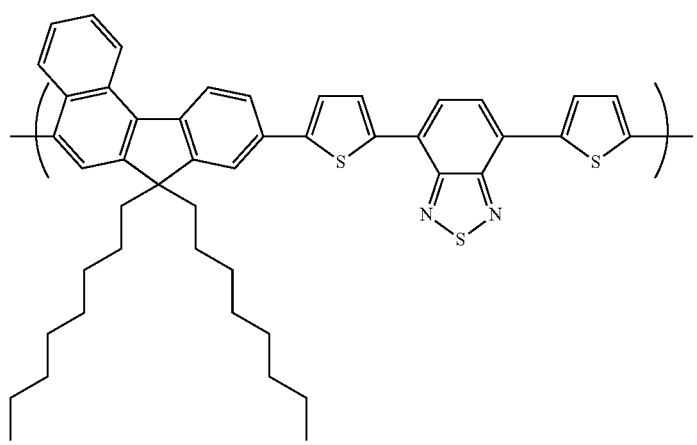

From the viewpoint of charge transporting property, the polymer compound A preferably contains a repeating unit represented by the formula (5):

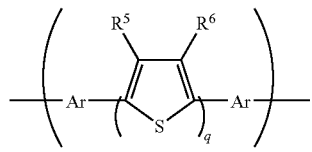

(5)

wherein Ar, $R^5$, $R^6$ and q have the same meanings as defined above, and two Ar's may be the same or different.

From the viewpoint of luminous efficiency of an organic photoelectric converter, the repeating unit represented by the formula (5) is preferably a repeating unit represented by the formula (9):

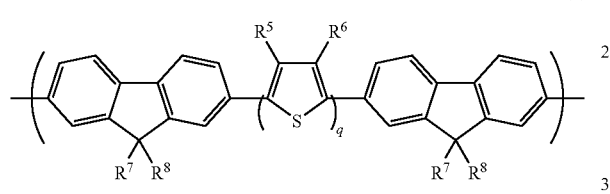

(9)

wherein $R^5$, $R^6$, $R^7$, $R^8$ and q have the same meanings as defined above; two $R^7$'s may be the same or different; and two $R^8$'s may be the same or different.

From the viewpoint of charge transporting property, the polymer compound A contains a repeating unit represented by the formula (16):

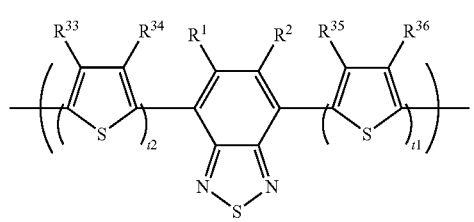

(16)

wherein $R^{33}$, $R^{34}$, $R^{35}$ and $R^{36}$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group; t1 and t2 each independently represent an integer of 1 or 2; when a plurality of $R^{33}$'s, $R^{34}$'s, $R^{35}$'s and $R^{36}$'s exist, they may be the same or different; and $R^1$ and $R^2$ have the same meanings as defined above.

In the formula (16), the definitions and the specific examples of the alkyl group, the alkoxy group, the alkylthio group, the aryl group, the aryloxy group, the arylthio group, the arylalkyl group, the arylalkoxy group and the arylalkylthio group represented by $R^{33}$ to $R^{36}$ are the same as those in the above description for $R^1$.

Examples of a group represented by the formula (16) include the following groups.

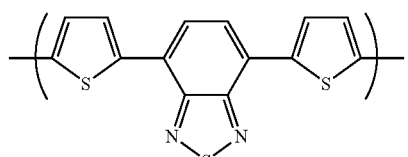

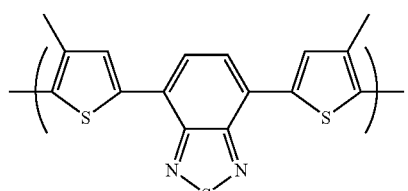

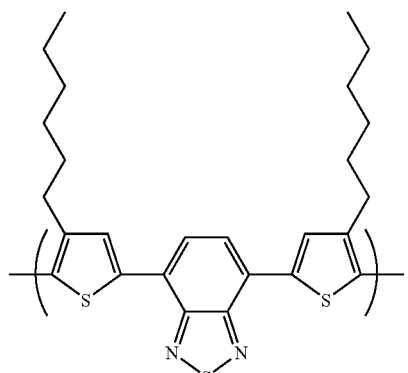

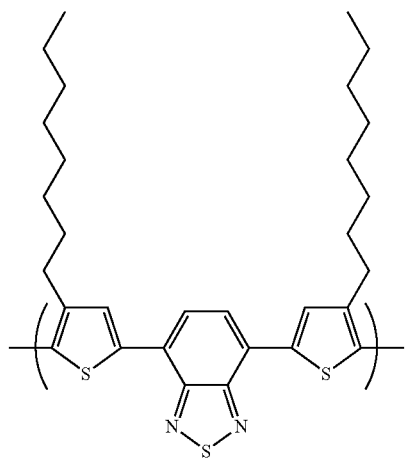

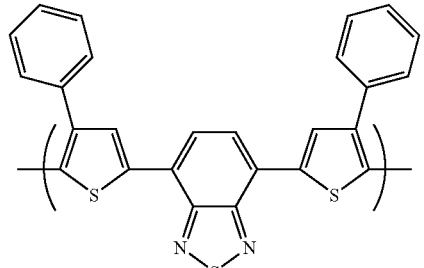

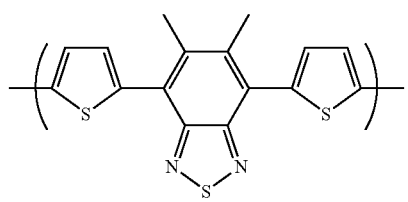

-continued

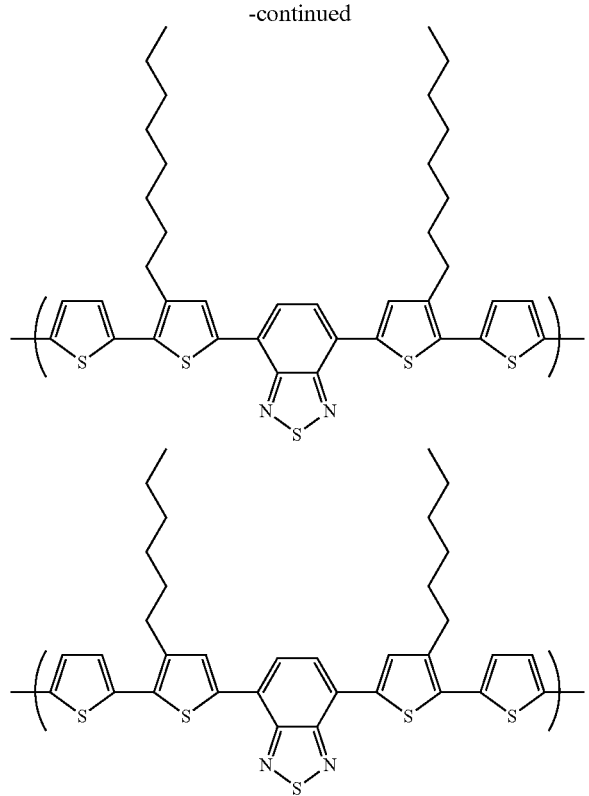

The repeating unit represented by the formula (16) is preferably a repeating unit represented by the formula (10):

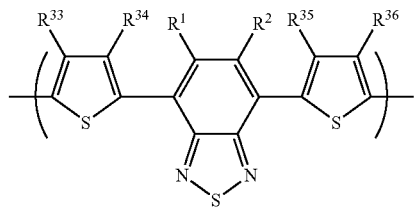

(10)

wherein $R^1$, $R^2$, $R^{33}$, $R^{34}$, $R^{35}$ and $R^{36}$ have the same meanings as defined above.

From the viewpoint of charge transporting property, the polymer compound A preferably contains a block containing a repeating unit represented by the formula (1).

From the viewpoint of charge transporting property, the block containing a repeating unit represented by the formula (1) is preferably a block containing one or more repeating units selected from a repeating unit represented by the formula (12), a repeating unit represented by the formula (13) and a repeating unit represented by the formula (14):

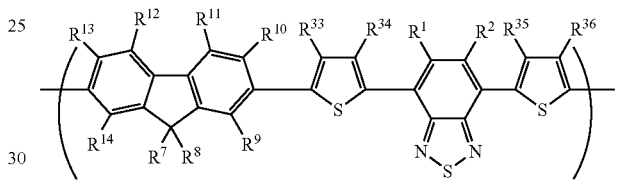

(12)

wherein $R^1$, $R^2$, $R^7$, $R^8$, $R^9$, $R^{10}$, $R^{11}$, $R^{12}$, $R^{13}$, $R^{14}$, $R^{33}$, $R^{34}$, $R^{35}$ and $R^{36}$ have the same meanings as defined above;

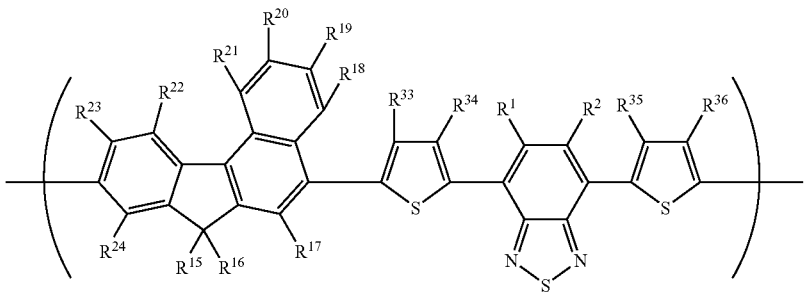

(13)

wherein $R^1$, $R^2$, $R^{15}$, $R^{16}$, $R^{17}$, $R^{18}$, $R^{19}$, $R^{20}$, $R^{21}$, $R^{22}$, $R^{23}$, $R^{24}$, $R^{33}$, $R^{34}$, $R^{35}$ and $R^{36}$ have the same meanings as defined above; and

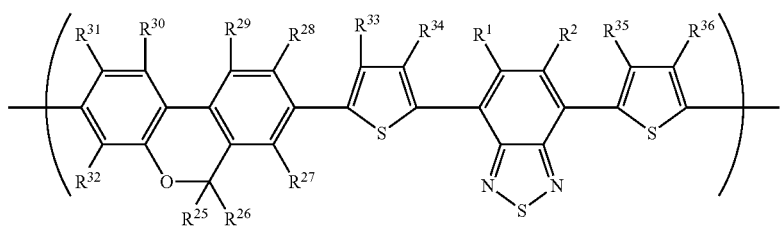

(14)

wherein $R^1$, $R^2$, $R^{25}$, $R^{26}$, $R^{27}$, $R^{28}$, $R^{29}$, $R^{30}$, $R^{31}$, $R^{32}$, $R^{33}$, $R^{34}$, $R^{35}$ and $R^{36}$ have the same meanings as defined above.
Examples of the repeating unit represented by the formula (12) include the following repeating units.
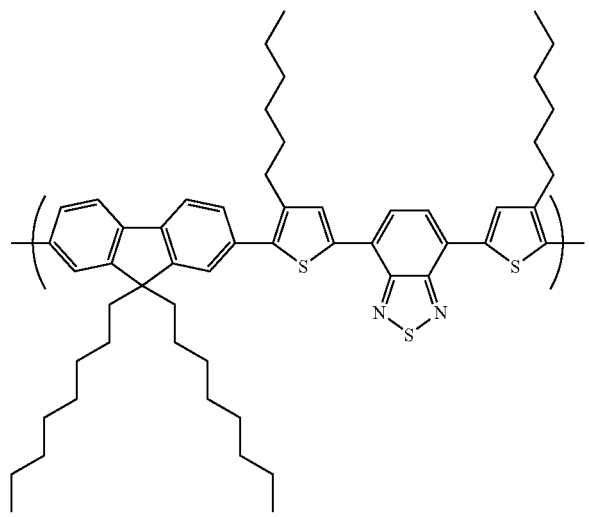
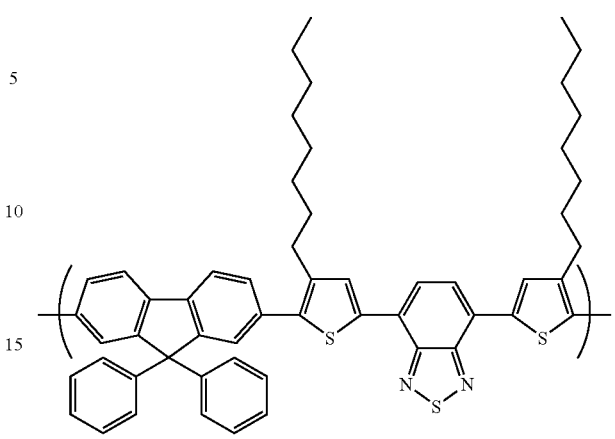
Examples of the repeating unit represented by the formula (13) include the following repeating unit.
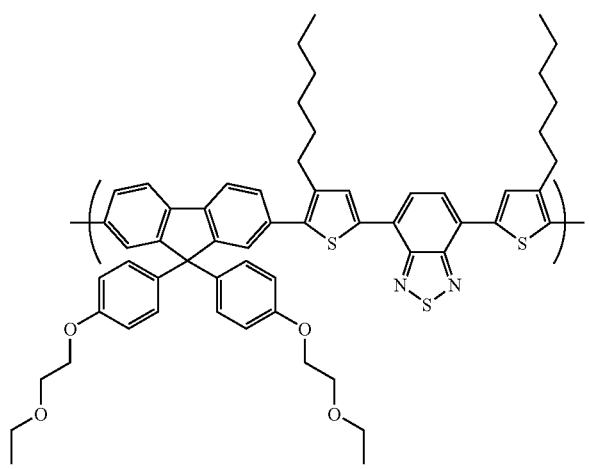
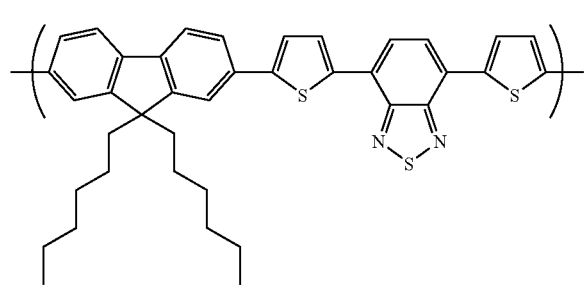

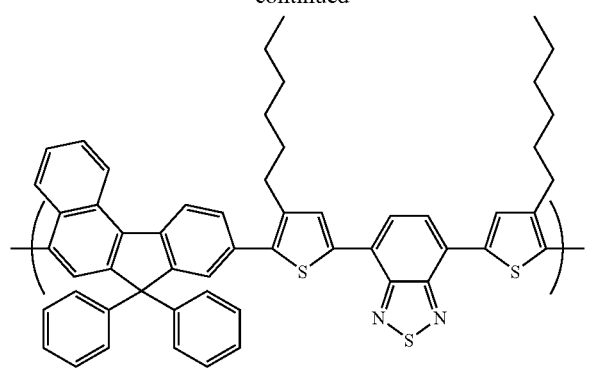
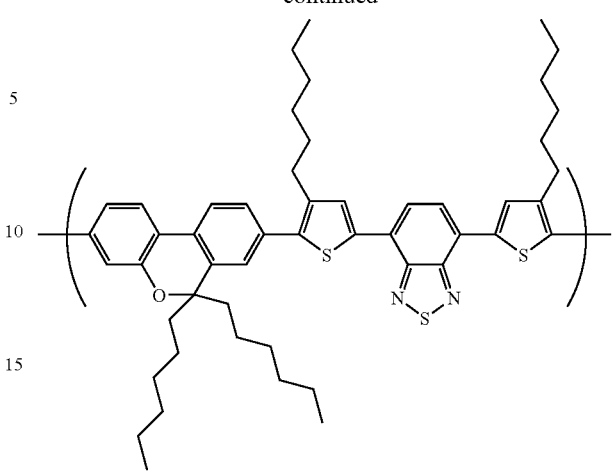
Examples of the repeating unit represented by the formula (14) include the following repeating unit.
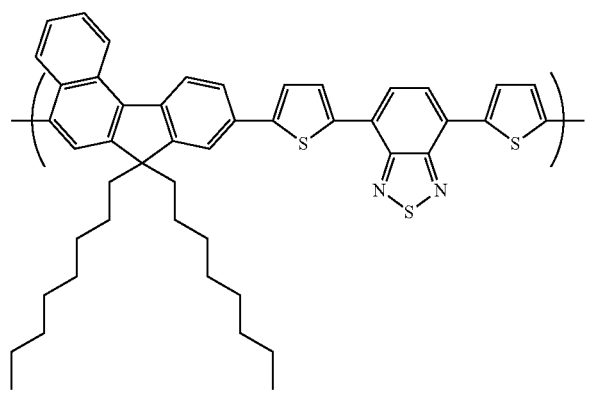
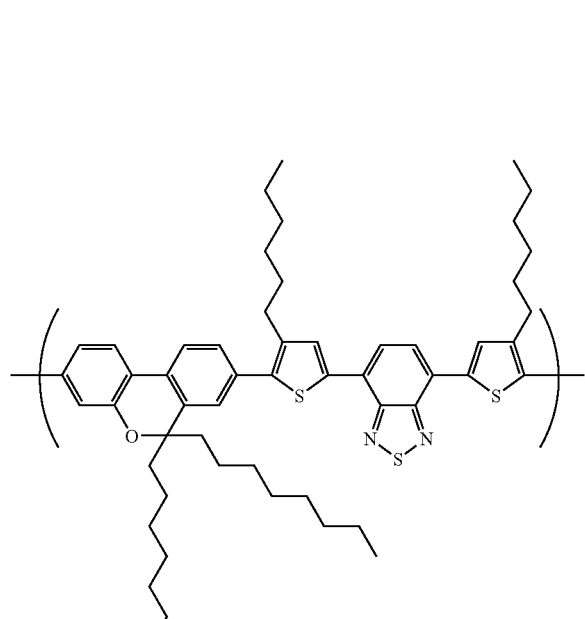
From the viewpoint of charge transporting property, the polymer compound A preferably contains a block containing a repeating unit represented by the formula (3), and examples thereof include blocks containing the following repeating units.

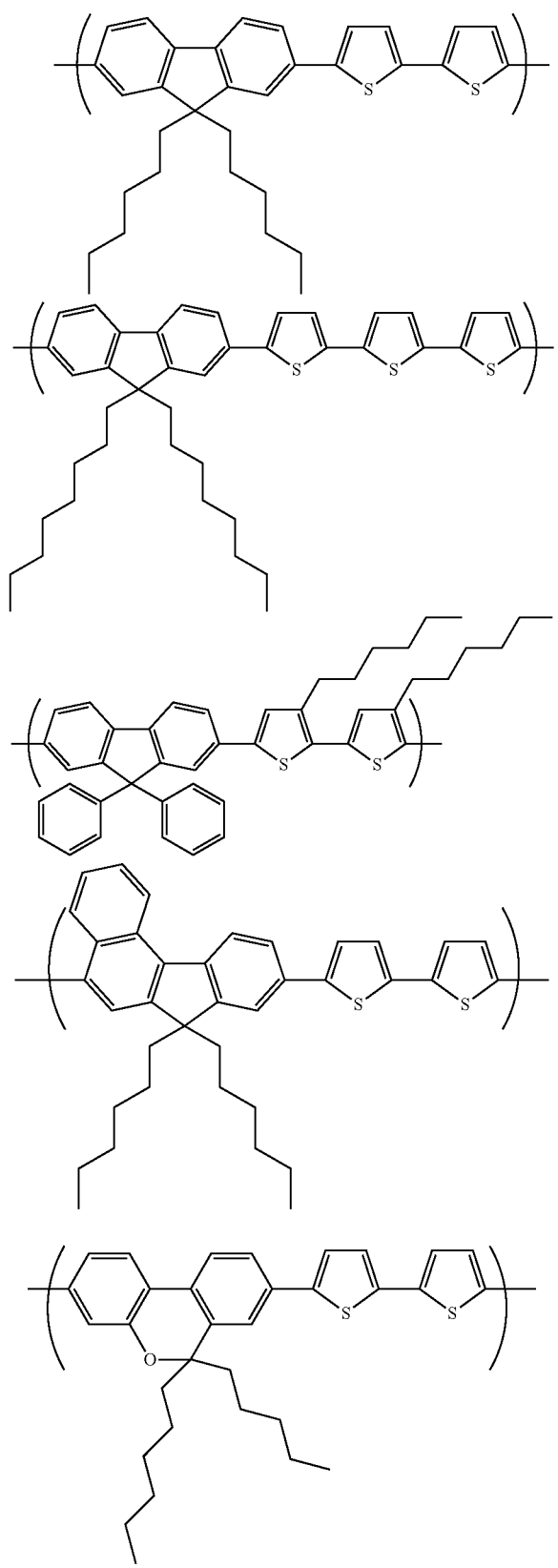

When the polymer compound A contains a block, examples of the block include a block composed of a repeating unit represented by the formula (1), a block composed of a repeating unit represented by the formula (3), a block composed of a repeating unit represented by the formula (4), a block composed of a repeating unit represented by the formula (1) and a repeating unit represented by the formula (4), and a block composed of a repeating unit represented by the formula (3) and a repeating unit represented by the formula (4).

Examples of a sequential arrangement of the block contained in the polymer compound of the present invention include:

$X_k$-block-$Y_m$,
$X_k$-block-$(YZ)_m$,
$(XZ)_k$-block-$Y_m$,
$(XZ)_k$-block-$(YZ)_m$, and
$(XZ)_k$-block-$(YZ)_m$-block-$Z_n$:

wherein X represents a repeating unit represented by the formula (1); Y represents a repeating unit represented by the formula (3); Z represents a repeating unit represented by the formula (4);

k, m and n represent the number of repeating units; and when a plurality of X's, Y's and Z's exist, they may be the same or different.

When the total number of mols of the whole repeating units contained in the polymer compound A is 100, the number of mols of the repeating unit represented by the formula (1) is preferably from 1 to 99, and more preferably from 10 to 80. The number of mols of the repeating unit represented by the formula (3) is preferably 99 or less, and more preferably from 80 to 10. The number of mols of the repeating unit represented by the formula (4) is preferably from 1 to 99, and more preferably from 10 to 80.

When the polymer compound A contains a block containing a repeating unit represented by the formula (1), a number average molecular weight of the block is preferably from $1 \times 10^3$ to $1 \times 10^5$, and more preferably from $1 \times 10^4$ to $1 \times 10^5$ in terms of polystyrene, from the viewpoint of photoelectric conversion efficiency characteristics and solubility of the converter. A weight average molecular weight of the block is preferably from $1 \times 10^3$ to $1 \times 10^5$, and more preferably from $1 \times 10^4$ to $1 \times 10^5$ in terms of polystyrene.

When the polymer compound A contains a block containing a repeating unit represented by the formula (3), a number average molecular weight of the block is preferably from $1 \times 10^3$ to $1 \times 10^5$, and more preferably from $1 \times 10^4$ to $1 \times 10^5$ in terms of polystyrene, from the viewpoint of photoelectric conversion efficiency characteristics and solubility of the converter. A weight average molecular weight of the block is preferably from $1 \times 10^3$ to $1 \times 10^5$, and more preferably from $1 \times 10^4$ to $1 \times 10^5$ in terms of polystyrene.

<Polymer Compound B>

In the polymer compound B, $R^3$ and $R^4$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and the hydrogen atom contained in these groups may be substituted with a fluorine atom, and p represents an integer of 2 to 10 in the formula (2). A plurality of $R^3$'s may be the same or different, and a plurality of $R^4$'s may be the same or different.

In the formula (2), examples of the alkyl group, the alkoxy group, the alkylthio group, the aryl group, the aryloxy group, the arylthio group, the arylalkyl group, the arylalkoxy group and the arylalkylthio group represented by $R^3$ and $R^4$ include the same groups as in the case of $R^1$.

Examples of the repeating unit represented by the formula (2) include the following repeating units.

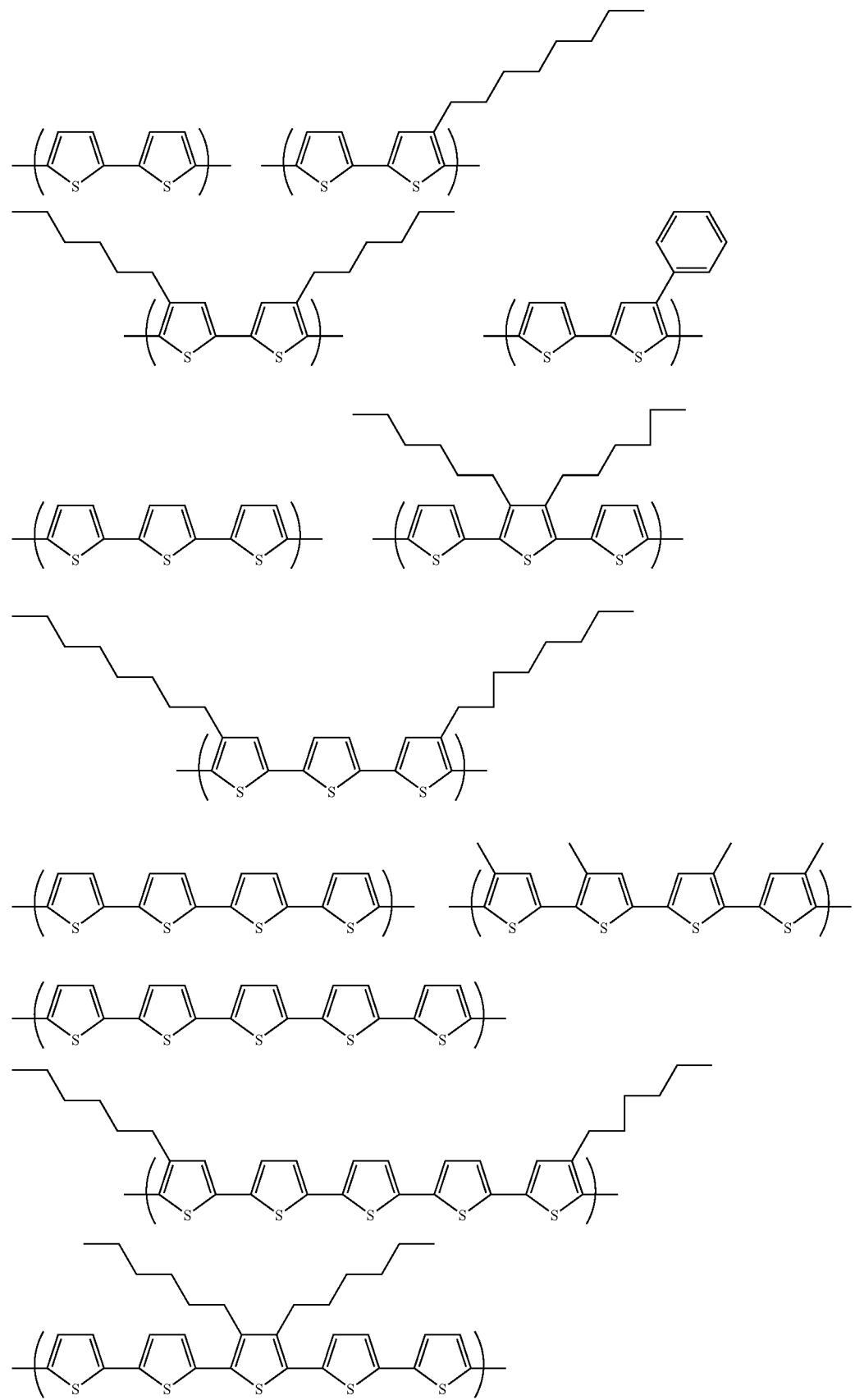

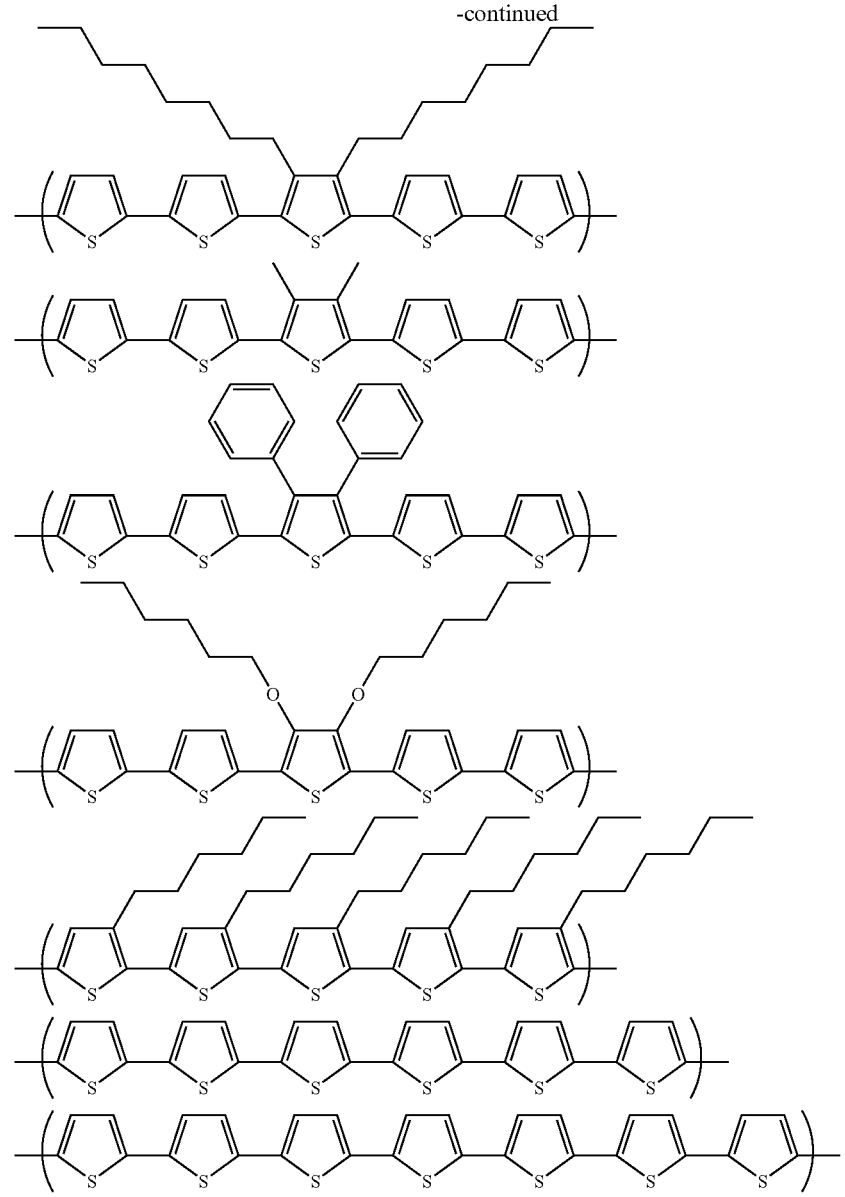

In the formula (2), p is preferably from 2 to 7, more preferably from 2 to 5, and still more preferably 5, from the viewpoint of charge transporting property.

The formula (2) is preferably a repeating unit represented by the formula (11):

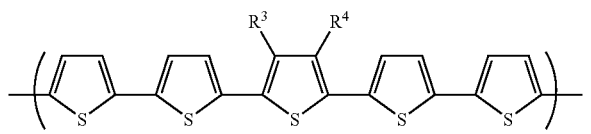

(11)

wherein $R^3$ and $R^4$ have the same meanings as defined above.

In the formula (11), $R^3$ is preferably a hydrogen atom or an alkyl group, and more preferably an alkyl group. Further, $R^4$ is preferably a hydrogen atom or an alkyl group, and more preferably an alkyl group.

It is preferable that the polymer compound B further contain a repeating unit represented by the formula (4) from the viewpoint of ease of increasing the polymerization degree. When the polymer compound B contains a repeating unit represented by the formula (4), Ar is preferably a group represented by the formula (6), a group represented by the formula (7) or a group represented by the formula (8), and more preferably a group represented by the formula (6). The polymer compound A may contain two or more repeating units represented by the formula (4).

When the total number of mols of the whole repeating units contained in the polymer compound B is 100, the number of mols of the repeating unit represented by the formula (2) is preferably from 1 to 99, and more preferably from 10 to 90. The number of mols of the repeating unit represented by the formula (4) is preferably from 99 to 1, and more preferably from 90 to 10.

A number average molecular weight of the polymer compounds A and B contained in the composition of the present invention is preferably from $1\times10^3$ to $1\times10^8$, and more preferably from $1\times10^4$ to $1\times10^7$ in terms of polystyrene, from the viewpoint of photoelectric conversion efficiency characteristics and solubility in an organic solvent of the element. A weight average molecular weight of the polymer compounds A and B is preferably from $1\times10^3$ to $1\times10^8$, and more preferably from $1\times10^4$ to $1\times10^7$ in terms of polystyrene.

In the present invention, the number average molecular weight and the weight average molecular weight in terms of polystyrene can be determined by gel permeation chromatography (GPC).

The polymer compound contained in the composition of the present invention may be a homopolymer, or may be a random, block, alternative or graft copolymer, or may be a polymer having an intermediate structure thereof, for example, a blocked random copolymer. The polymer compound of the present invention may have a branched main chain or three or more terminals, and also includes a dendrimer.

When a polymerization-active group remains at the terminal of the polymer compound, photoelectric conversion efficiency of the resultant converter may decrease. Therefore, the terminal of the polymer compound may be protected with a stable protecting group. The protecting group preferably has a conjugated bond continued to a conjugated structure of a main chain and, for example, those having a structure bonded with an aryl group or a heterocyclic group via a carbon-carbon bond are shown. Examples of the protecting group include substituents described in Chemical Formula 10 of Japanese Unexamined Patent Publication No. 9-45478.

Examples of a good solvent to the composition of the present invention include chloroform, methylene chloride, dichloroethane, tetrahydrofuran, toluene, xylene, mesitylene, tetralin, decalin and n-butylbenzene. Although the concentration of the composition varies depending on the structure or molecular weight of the polymer compound, it is possible to usually dissolve 0.1% by weight or more of the polymer compound in these solvents.

<Method for Producing Polymer Compound>

The method for producing a polymer compound contained in the composition of the present invention will be described below.

The polymer compound used in the present invention can be produced by optionally dissolving a compound having two substituents involved in condensation polymerization, as a raw compound (monomer), in an organic solvent, and reacting the solution at a temperature, which is a melting point or higher of the organic solvent and a boiling point or lower of the organic solvent, using an alkali or a proper catalyst. In the production of the polymer compound, for example, it is possible to use known methods described in "Organic Reactions", Vol. 14, pp. 270-490, John Wiley&Sons, Inc., 1965; "Organic Syntheses", Collective Volume VI, pp. 407-411, John Wiley&Sons, Inc., 1988; Chem. Rev, Vo. 95, pp. 2457 (1995); J. Organomet. Chem., Vol. 576, pp. 147 (1999) and Macromol. Chem., Macromol. Symp., Vo. 12, pp. 229 (1987).

In the method for producing a polymer compound contained in the composition of the present invention, known condensation reaction can be used according to the substituent involved in the condensation polymerization. Examples include a method of polymerizing a corresponding monomer by a Suzuki coupling reaction, a method of polymerizing a corresponding monomer by a Grignard reaction, a method of polymerizing a corresponding monomer by a zero-valent nickel complex, a method of polymerizing a corresponding monomer by an oxidizing agent such as $FeCl_3$, a method of polymerizing a corresponding monomer by an electrochemical oxidative polymerization, and a method of decomposing an intermediate polymer having a proper leaving group. Of these methods, a method of polymerizing by a Suzuki coupling reaction, a method of polymerizing by a Grignard reaction, and a method of polymerizing by a zero-valent nickel complex are preferable because it is easy to control a structure.

When the polymer compound contained in the composition of the present invention is a block polymer, examples of the method of synthesizing the block polymer include a method in which a high-molecular weight first block is prepared and a monomer constituting a second block is added thereto, and then the mixture is polymerized, and a method in which a high-molecular weight first block and a high-molecular weight second block are synthesized in advance and these blocks are linked.

In the method for producing a polymer compound contained in the composition of the present invention, examples of the substituent involved in the condensation polymerization include a halogen atom, an alkylsulfo group, an arylsulfo group, an arylalkylsulfo group, a boric acid ester group, a sulfoniummethyl group, a phosphoniummethyl group, a phosphonatemethyl group, a monohalogenated methyl group, —$B(OH)_2$, a formyl group, a cyano group or a vinyl group.

Examples of the alkylsulfo group include a methanesulfo group, an ethanesulfo group and a trifluoromethanesulfo group. Examples of the arylsulfo group include a benzenesulfo group and a p-toluenesulfo group. Examples of the arylalkylsulfo group include a benzylsulfo group.

Examples of the boric acid ester group include groups represented by the following formulas:

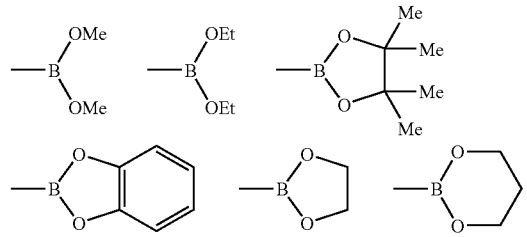

wherein Me represents a methyl group, and Et represents an ethyl group.

Examples of the sulfoniummethyl group include groups represented by the following formulas:

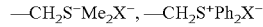

wherein X represents a halogen atom; Me represents a methyl group; and Ph represents a phenyl group.

Examples of the phosphoniummethyl group include a group represented by the following formula:

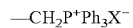

wherein X represents a halogen atom, and Ph represents a phenyl group.

Examples of the phosphonatemethyl group include a group represented by the following formula:

wherein R' represents an alkyl group, an aryl group or an arylalkyl group.

Examples of the monohalogenated methyl group include a methyl fluoride group, a methyl chloride group, a methyl bromide group or a methyl iodide group.

The substituent suited as the substituent involved in the condensation polymerization varies depending on the kind of the polymerization reaction. In the case of the reaction using a zero-valent nickel complex (Ni(0) complex), for example, a Yamamoto coupling reaction, a halogen atom, an alkylsulfo group, an arylsulfo group or an arylalkylsulfo group is exemplified. In the case of the reaction using a nickel catalyst or a palladium catalyst, for example, a Suzuki coupling reaction, an alkylsulfo group, a halogen atom, a boric acid ester group or —B(OH)$_2$ is shown.

The method for producing a polymer compound is preferably a method in which the substituent involved in the condensation polymerization is independently selected from a halogen atom, an alkylsulfo group, an arylsulfo group or an arylalkylsulfo group, and condensation polymerization is carried out in the presence of a zero-valent nickel complex. Examples of the raw compound include a dihalogen compound, a bis(alkyl sulfonate) compound, a bis(aryl sulfonate) compound, a bis(arylalkyl sulfonate) compound, a halogenalkyl sulfonate compound, a halogen-aryl sulfonate compound, a halogen-arylalkyl sulfonate compound, an alkyl sulfonate-aryl sulfonate compound, an alkyl sulfonate-arylalkyl sulfonate compound, and an arylsulfonate-arylalkyl sulfonate compound. There is also exemplified a method in which a sequence-controlled polymer compound is produced by using a halogen-alkyl sulfonate compound, a halogen-aryl sulfonate compound, a halogen-arylalkyl sulfonate compound, an alkyl sulfonate-aryl sulfonate compound, an alkyl sulfonate-arylalkyl sulfonate compound or an arylsulfonate-arylalkyl sulfonate compound as a raw compound.

The method for producing a polymer compound is preferably a method in which the substituent involved in the condensation polymerization is independently selected from a halogen atom, an alkylsulfo group, an arylsulfo group, an arylalkylsulfo group, a boric acid group (—B(OH)$_2$) or a boric acid ester group, and a ratio K/J of the total (J) of the number of mols of a halogen atom, an alkylsulfo group, an arylsulfo group and an arylalkylsulfo group to the total (K) of the number of mols of a boric acid group and a boric acid ester group contained in the whole raw compound is substantially 1 (usually within a range from 0.7 to 1.2), and the condensation polymerization is carried out using a nickel catalyst or a palladium catalyst.

Examples of a combination of raw compounds include a combination of a dihalogenated compound, a bis(alkyl sulfonate) compound, a bis(aryl sulfonate) compound or a bis(arylalkyl sulfonate) compound with a diboric acid compound or a diboric acid ester compound. Examples of the raw compound include a halogen-boric acid compound, a halogen-boric acid ester compound, an alkyl sulfonate-boric acid compound, an alkyl sulfonate-boric acid ester compound, an aryl sulfonate-boric acid compound, an aryl sulfonate-boric acid ester compound, an arylalkyl sulfonate-boric acid compound and an arylalkyl sulfonate-boric acid ester compound. There is also exemplified a method in which a sequence-controlled polymer compound is produced by using a halogen-boric acid compound, a halogen-boric acid ester compound, an alkyl sulfonate-boric acid compound, an alkyl sulfonate-boric acid ester compound, an aryl sulfonate-boric acid compound, an aryl sulfonate-boric acid ester compound, an arylalkyl sulfonate-boric acid compound or an arylalkyl sulfonate-boric acid ester compound as a raw compound.

Although the solvent used for the reaction varies depending on the raw compound or the reaction used, it is preferred to sufficiently be subjected to a deoxidation treatment so as to inhibit the side reaction. It is preferred to allow the reaction to proceed under an inert atmosphere. Similarly, it is preferred to subject the solvent used for the reaction to a dehydration treatment.

This should not be applied to the case of a two-phase reaction with water, such as a Suzuki coupling reaction.

Examples of the solvent include saturated hydrocarbons such as pentane, hexane, heptane, octane, cyclohexane and decalin; aromatic hydrocarbons such as benzene, toluene, ethylbenzene, n-butylbenzene, xylene and tetralin; halogenated saturated hydrocarbons such as carbon tetrachloride, chloroform, dichloromethane, chlorobutane, bromobutane, chloropentane, bromopentane, chlorohexane, bromohexane, chlorocyclohexane and bromocyclohexane; halogenated aromatic hydrocarbons such as chlorobenzene, dichlorobenzene and trichlorobenzene; alcohols such as methanol, ethanol, propanol, isopropanol, butanol and t-butyl alcohol; carboxylic acids such as formic acid, acetic acid and propionic acid; ethers such as dimethyl ether, diethyl ether, methyl t-butyl ether, tetrahydrofuran, tetrahydropyran and dioxane; amines such as trimethylamine, triethylamine, N,N,N',N'-tetramethylethylenediamine and pyridine; and amides such as N,N-dimethylformamide, N,N-dimethylacetamide, N,N-diethylacetamide and N-methylmorpholine oxide. These solvents may be used alone or in combination.

In order to carry out the reaction, an alkali or a proper catalyst is appropriately added. They may be selected according to the reaction used. Preferred is an alkali or a catalyst sufficiently dissolved in the solvent used in the reaction. Examples of the alkali include inorganic bases such as potassium carbonate and sodium carbonate; organic bases such as triethylamine; and inorganic salts such as cesium fluoride. Examples of the catalyst include palladium [tetrakis(triphenylphosphine)] and palladium acetates. Examples of the method of mixing the alkali or the catalyst include a method in which a solution of an alkali or a catalyst is slowly added while stirring a reaction solution under an inert atmosphere of argon or nitrogen, or a reaction solution is slowly added to a solution of an alkali or a catalyst.

When the polymer compound contained in the composition of the present invention is used for an organic solar battery, since purity thereof exerts an influence on performances such as photoelectric conversion efficiency of the element, it is preferable that a monomer before polymerization be purified by a method such as distillation, sublimation purification or recrystallization and then polymerized. After the polymerization, it is preferred to be subjected to a purification treatment such as reprecipitation purification, or fractionation by chromatography.

<Composition>

The composition of the present invention contains a polymer compound A and a polymer compound B. When the total weight of the polymer compound A and the polymer compound B is 100, the content of the polymer compound B is preferably from 1 to 99, and more preferably from 10 to 90. The content of the polymer compound A is preferably from 99 to 1, and more preferably from 90 to 10.

The composition of the present invention may further contain an electron-accepting compound. Examples of the electron-accepting compound include an oxadiazole derivative, anthraquinodimethane and a derivative thereof, benzoquinone and a derivative thereof, naphthoquinone and a derivative thereof, anthraquinone and a derivative thereof, tetracyanoanthraquinodimethane and a derivative thereof, a fluorenone derivative, diphenyldicyanoethylene and a derivative thereof, a diphenoquinone derivative, 8-hydroxyquinoline and a derivative thereof metal complex, polyquinoline and a derivative thereof, polyquinoxaline and a derivative thereof, polyfluorene and a derivative thereof, fullerenes such as $C_{60}$ and a derivative thereof, carbon nanotube, and phenanthroline derivatives such as 2,9-dimethyl-4,7-diphenyl-1,10-phenanthroline, and fullerenes and a derivative thereof are preferable.

When the total weight of the polymer compound A and the polymer compound B contained in the composition of the present invention is 100 parts by weight, the weight of the electron-accepting compound is preferably from 10 to 1,000 parts by weight, and more preferably from 50 to 500 parts by weight.

Examples of fullerenes include $C_{60}$, $C_{70}$, $C_{84}$ and derivatives thereof. Specific examples of the derivative of fullerene include the followings.

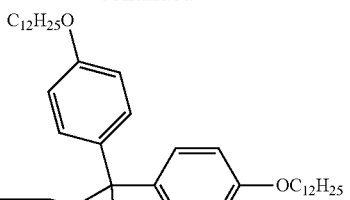

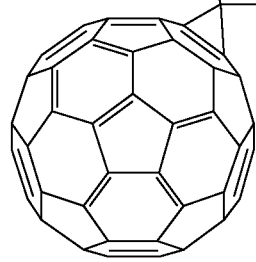

-continued

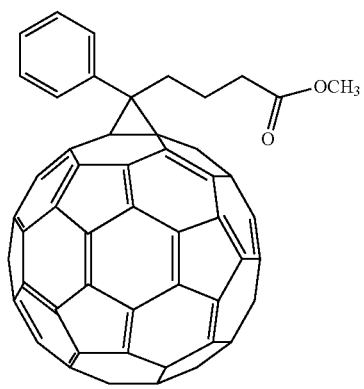

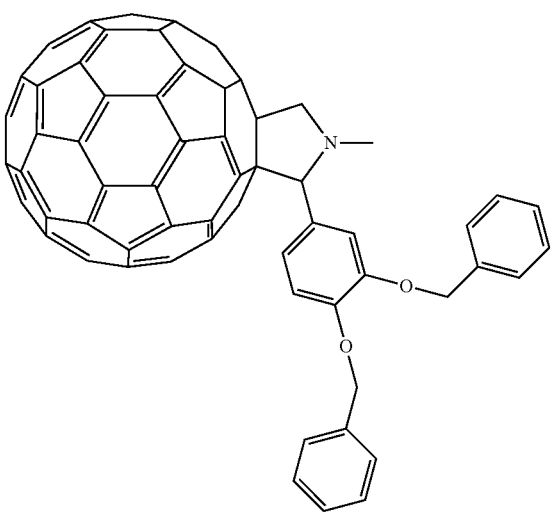

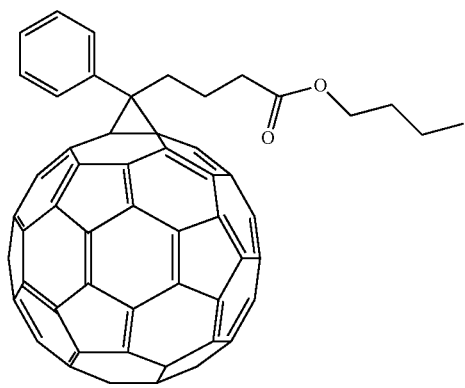

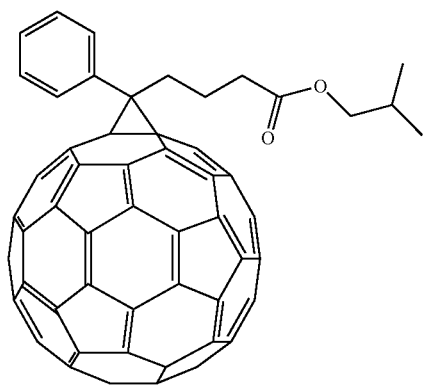

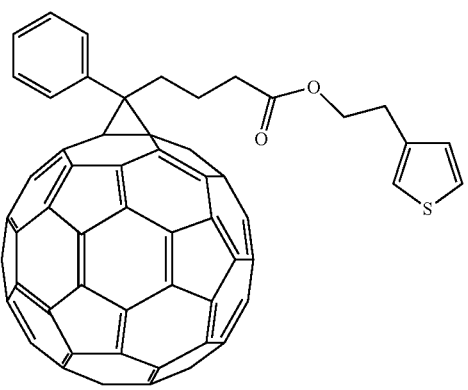

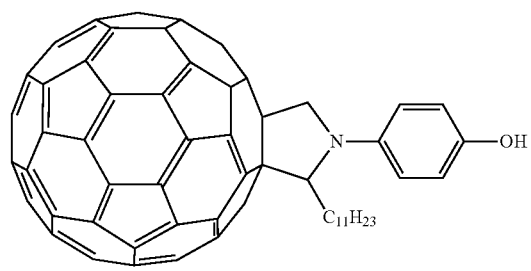

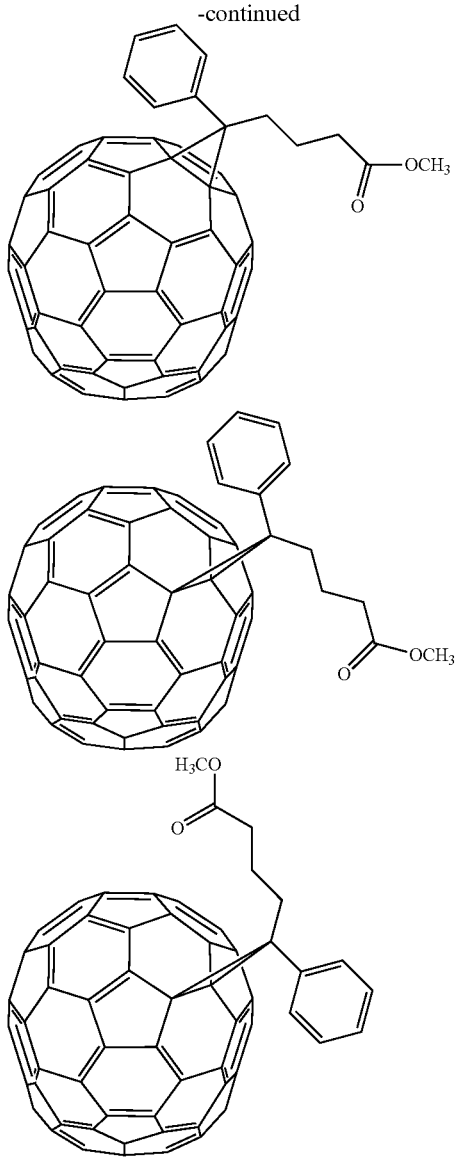

The composition of the present invention may further contain an electron-donating compound. Examples of the electron-donating compound include a pyrazoline derivative, an arylamine derivative, a stilbene derivative, a triphenyldiamine derivative, oligothiophene and a derivative thereof, polyvinyl carbazole and a derivative thereof, polysilane and a derivative thereof, a polysiloxane derivative having an aromatic amine in a side chain or a main chain, polyaniline and a derivative thereof, polythiophene and a derivative thereof, polypyrrole and a derivative thereof, polyphenylene vinylene and a derivative thereof, polythienylene vinylene and a derivative thereof.

When the total weight of the polymer compound A and the polymer compound B contained in the composition of the present invention is 100 parts by weight, the weight of the electron-donating compound is preferably from 10 to 1,000 parts by weight, and more preferably from 50 to 500 parts by weight.

The composition of the present invention may further contain a solvent and the solvent is not particularly limited as long as it dissolves the composition of the present invention.

Examples of the solvent include unsaturated hydrocarbon solvents such as toluene, xylene, mesitylene, tetraphosphorus, decalin, bicyclohexyl, n-butylbenzene, sec-butylbenzene and t-butylbenzene; halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane and bromocyclohexane; halogenated unsaturated hydrocarbon solvents such as chlorobenzene, dichlorobenzene and trichlorobenzene; and ether solvents such as tetrahydrofuran and tetrahydropyran. Usually, 0.1% by weight or more of the composition of the present invention can be dissolved in the solvents described above.

<Organic Photoelectric Converter>

The organic photoelectric converter of the present invention comprises a pair of electrodes, at least one of which is transparent or translucent, and a layer containing the composition of the present invention provided between the electrodes. The composition of the present invention can also be used as an electron-accepting compound or an electron-donating compound, but is preferably used as an electron-donating compound.

The operation mechanism of the organic photoelectric converter will be described below. Light energy made incident from a transparent or translucent electrode is absorbed to an electron-accepting compound and/or an electron-donating compound to generate excitons in which electrons and holes are bonded. When excitons thus generated move and reach the heterojunction interface where the electron-accepting compound and the electron-donating compound are adjacent with each other, electrons are separated from holes at the interface due to a difference between HOMO energy and LUMO energy to generate charges (electrons and holes) capable of independently moving. The charges thus generated can be taken outside as electric energy (electric current) by moving to each electrode.

Specific examples of the organic photoelectric converter of the present invention include:

1. An organic photoelectric converter comprising a pair of electrodes; a first organic layer containing the composition of the present invention provided between the electrodes; and a second organic layer containing an electron-donating compound provided adjacent to the first organic layer;
2. An organic photoelectric converter comprising a pair of electrodes; a first organic layer containing an electron-accepting compound provided between the electrodes; and a second organic layer containing the composition of the present invention provided adjacent to the first organic layer;
3. An organic photoelectric converter comprising a pair of electrodes; and at least one organic layer containing the composition of the present invention (a composition containing an electron-donating compound, in addition to a polymer compound A and a polymer compound B) provided between the electrodes;
4. An organic photoelectric converter comprising a pair of electrodes; and an organic layer containing the composition of the present invention (a composition containing an electron-accepting compound, in addition to a polymer compound A and a polymer compound B) provided between the electrodes; and
5. An organic photoelectric converter comprising a pair of electrodes; and at least one organic layer containing the composition of the present invention (a composition containing an electron-accepting compound, in addition to a polymer compound A and a polymer compound B) provided between the electrodes, wherein the electron-accepting compound is a fullerene derivative.

In the organic photoelectric converter according to the above 5, the content of the fullerene derivative in the organic layer containing the composition of the present invention is preferably from 10 to 1,000 parts by weight, and more preferably from 50 to 500 parts by weight, based on 100 parts by weight of the total of the polymer compound A and the polymer compound B.

From the viewpoint of containing a large amount of the heterojunction interface, the organic photoelectric converter of the present invention is preferably the organic photoelectric converter according to the above 3, 4 or 5, and more preferably the above 5. In the organic photoelectric converter of the present invention, an additional layer may be provided between at least one of the electrodes and the organic layer in the converter. The additional layer includes, for example, a charge transporting layer capable of transporting holes or electrons.

When the composition of the present invention is used as an electron donor, in an electron acceptor used suitably in the organic photoelectric converter, HOMO energy of the electron acceptor is higher than that of the polymer compound A and that of the polymer compound B, and also LUMO energy of the electron acceptor is higher than that of the polymer compound A and that of the polymer compound B. When the composition of the present invention is used as an electron acceptor, in an electron donor used suitably in the organic photoelectric converter, HOMO energy of the electron donor is lower than that of the polymer compound A and that of the polymer compound B, and also LUMO energy of the electron donor is lower than that of the polymer compound A and that of the polymer compound B.

The organic photoelectric converter of the present invention is usually formed on a substrate. This substrate may be any substrate as long as it does not change when an electrode is formed and a layer of an organic substance is formed. Examples of the material of the substrate include glass, plastic, a polymer film, and silicon. In the case of an opaque substrate, the opposite electrode (i.e., an electrode farther from the substrate) is preferably transparent or translucent.

Examples of the transparent or translucent electrode material include a conductive metal oxide film and a translucent metal thin film. Specific examples used as an electrode material include films (NESA, etc.) made of conductive materials such as indium oxide, zinc oxide, tin oxide, and complexes thereof such as indium tin oxide (ITO) and indium zinc oxide, and gold, platinum, silver and copper. ITO, indium zinc oxide and tin oxide are preferable. Examples of the method of producing an electrode include a vacuum deposition method, a sputtering method, an ion plating method and a plating method. It is possible to use, as the electrode material, organic transparent conductive film materials such as polyaniline and a derivative thereof, polythiophene and a derivative thereof. A metal and a conductive polymer can also be used as the electrode material, and one electrode of a pair of electrodes is preferably made of a material having a small work function. Examples thereof include metals such as lithium, sodium, potassium, rubidium, cesium, magnesium, calcium, strontium, barium, aluminum, scandium, vanadium, zinc, yttrium, indium, cerium, samarium, europium, terbium and ytterbium; alloys of two or more metals, or alloys of one or more metals and one or more metals among gold, silver, platinum, copper, manganese, titanium, cobalt, nickel, tungsten and tin; and graphite or a graphite intercalation compound. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

It is possible to use, as a material used for a charge transporting layer as the additive layer, i.e., a hole transporting layer or an electron transporting layer, the electron-donating compound and the electron-accepting compound. Examples of a material used for a buffer layer as the additive layer include fine particles of halides of alkali and alkaline earth metals, such as lithium fluoride, oxide, and inorganic semiconductors such as titanium oxide.

It is possible to use, as the organic layer (organic layer containing the composition of the present invention) in the organic photoelectric converter of the present invention, for example, an organic thin film containing the composition of the present invention.

The thickness of the organic thin film is usually from 1 nm to 100 μm, preferably from 2 nm to 1,000 nm, more preferably from 5 nm to 500 nm, and still more preferably from 20 nm to 200 nm.

It is also possible to mix a polymer other than the polymer compound B with a low molecular weight compound and/or the polymer compound A as the electron-donating compound and/or the electron-accepting compound in the organic thin film so as to enhance hole transportability of the organic thin film.

<Method for Producing Organic Thin Film>

Examples of the method for producing an organic thin film include, but are not limited to, a method by formation of a film from a solution containing the composition of the present invention and a method by a vacuum deposition method, and a method by formation of a film from a solution is preferable.

The solvent used for the formation of a film from a solution is not particularly limited as long as it dissolves the composition of the present invention. Examples of the solvent include unsaturated hydrocarbon solvents such as toluene, xylene, mesitylene, tetralin, decalin, bicyclohexyl, n-butylbenzene, sec-butylbenzene and tert-butylbenzene; halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane and bromocyclohexane; halogenated unsaturated hydrocarbon solvents such as chlorobenzene, dichlorobenzene and trichlorobenzene; and ether solvents such as tetrahydrofuran and tetrahydropyran. Usually, 0.1% by weight or more of the composition of the present invention can be dissolved in the solvent described above.

It is possible to use an applying method such as a spin coating method, a casting method, a microgravure coating method, a gravure coating method, a bar coating method, a roll coating method, a wire bar coating method, a dip coating method, a spray coating method, a screen printing method, a flexographic printing method, an offset printing method, an inkjet printing method, a dispenser printing method, a nozzle coating method and a capillary coating method so as to form a film from a solution. Among these methods, a spin coating method, a flexographic printing method, an inkjet printing method and a dispenser printing method are preferable.

<Applications of Device>

The organic photoelectric converter can be operated as an organic thin film solar battery by irradiation with light such as sunlight from a transparent or translucent electrode to generate a photoelectromotive force between electrodes. It is also possible to use as an organic thin film solar battery module by accumulation of a plurality of organic thin film solar batteries.

The organic photoelectric converter can be operated as an organic optical sensor by irradiation with light from a transparent or translucent electrode in a state where a voltage is applied between electrodes to generate a photocurrent. It is also possible to use as an organic image sensor by accumulation of a plurality of organic optical sensors.

EXAMPLES

Examples will be illustrated so as to describe the present invention in more detail, but the present invention is not limited thereto.

In the following Examples, a number average molecular weight and a weight average molecular weight of a polymer compound in terms of polystyrene were measured by GPC (trade name: LC-10Avp) manufactured by Shimadzu Corporation or GPC (PL-GPC2000) manufactured by GPC Laboratory.

In a case of measuring the molecular weight by GPC (LC-10Avp) manufactured by Shimadzu Corporation, 50 μL of a sample prepared by dissolving a polymer compound in tetrahydrofuran so as to have a concentration of about 0.5% by weight was injected into GPC. Tetrahydrofuran was used as a mobile phase of GPC and allowed to flow at a flow rate of 0.6 mL/min. Two TSKgel SuperHM-H (manufactured by TOSOH CORPORATION) and one TSKgel SuperH2000 (manufactured by TOSOH CORPORATION) were connected in series and used as a column. A differential refractive index detector (manufactured by Shimadzu Corporation under the trade name of RID-10A) was used as a detector.

In a case of measuring the molecular weight by GPC (PL-GPC2000) manufactured by GPC Laboratory, a solution prepared by dissolving a polymer compound in o-dichlorobenzene so as to have a concentration of about 1% by weight was used as a sample. o-dichlorobenzene was used as a mobile phase of GPC and was allowed to flow at a flow rate of 1 mL/min at a measuring temperature of 140° C. Three PLGEL 10 μm MIXED-B (manufactured by PL Laboratory) were connected in series and used as a column.

Synthesis Example 1

Synthesis of Polymer Compound 1

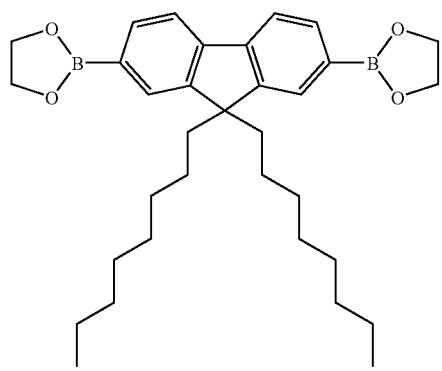

(C)

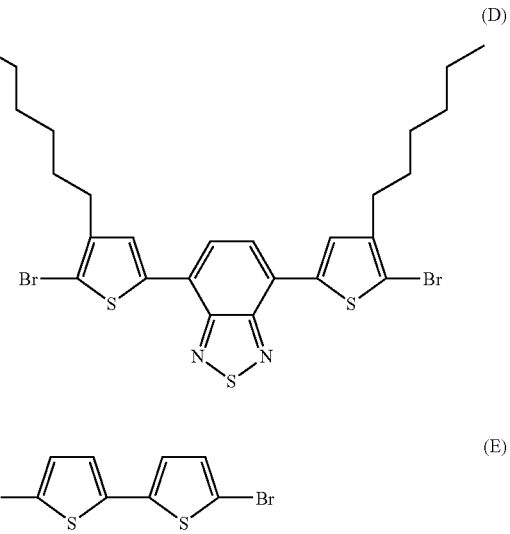

(D)

(E)

In a 200 ml separable flask, 0.65 g of methyltrioctylammonium chloride (trade name: aliquat 336, manufactured by Aldrich, $CH_3N[(CH_2)_7CH_3]_3Cl$, density of 0.884 g/ml, 25° C., trademark of Henkel Corporation), 1.5779 g of a compound (C) and 1.1454 g of a compound (E) were charged, followed by replacing an atmosphere with nitrogen. Toluene (35 ml) degassed by bubbling an argon gas in advance was added and, after dissolving under stirring, degassing was further carried out by bubbling an argon gas for 40 minutes. After raising a bath temperature (temperature of an oil bath) to 85° C., 1.6 mg of palladium acetate and 6.7 mg of tris o-methoxyphenylphosphine were added, and then 9.5 ml of a 17.5% aqueous sodium carbonate solution was added dropwise over 6 minutes while raising the bath temperature to 105° C. After the dropwise addition, stirring was carried out at the bath temperature of 105° C. for 1.7 hours and the reaction solution was cooled to room temperature. The reaction solution contains a polymer composed of a repeating unit represented by the formula (F).

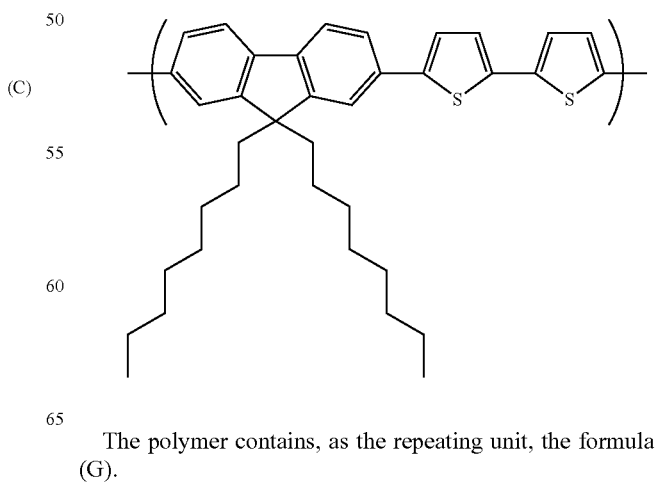

(F)

The polymer contains, as the repeating unit, the formula (G).

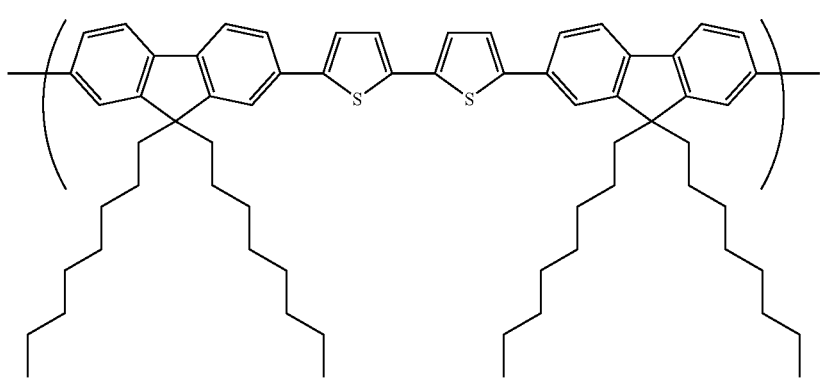

(G)

To the reaction solution, 1.0877 g of the compound (C) and 0.9399 g of a compound (D) were then added and 15 ml of toluene degassed by bubbling an argon gas in advance was added and, after dissolving under stirring, degassing was further carried out by bubbling an argon gas for 30 minutes. After adding 1.3 mg of palladium acetate and 4.7 mg of tris o-methoxyphenylphosphine, 6.8 ml of a 17.5% aqueous sodium carbonate solution was added dropwise over 5 minutes while raising a bath temperature to 105° C. After the dropwise addition, stirring was carried out at the bath temperature of 105° C. for 3 hours. After stirring, 50 ml of toluene degassed by bubbling an argon gas in advance, 2.3 mg of palladium acetate, 8.8 mg of tris o-methoxyphenylphosphine and 0.305 g of phenylboric acid were added, followed by stirring at the bath temperature of 105° C. for about 8 hours. After removing the aqueous layer, an aqueous solution prepared by dissolving 3.1 g of sodium N,N-diethyldithiocarbamate in 30 ml of water was added, followed by stirring at the bath temperature of 85° C. for 2 hours. The reaction solution was separated by adding 250 ml of toluene and the organic phase was washed twice with 65 ml of water, washed twice with 65 ml of 3% aqueous acetic acid and then washed twice with 65 ml of water. After diluting by adding 150 ml of toluene, the solution was added dropwise in 2,500 ml of methanol thereby to reprecipitate a polymer. The polymer was filtered, dried under reduced pressure, dissolved in 500 ml of toluene and then passed through a silica gel-alumina column, and then the resultant toluene solution was added dropwise in 3,000 ml of methanol thereby to reprecipitate a polymer. The polymer was filtered and dried under reduced pressure to obtain 3.00 g of a polymer compound 1. The resultant polymer compound 1 had a weight average molecular weight of 257,000 and a number average molecular weight of 87,000 in terms of polystyrene.

The polymer compound 1 has a block composed of a repeating unit represented by the formula (F) and a block composed of a repeating unit represented by the formula (H):

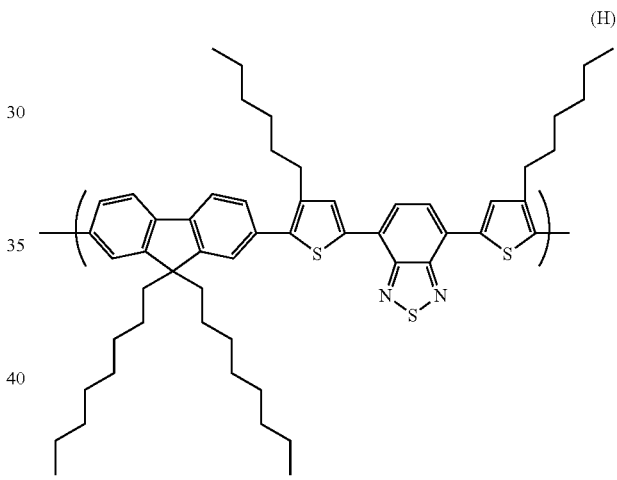

(H)

and is represented by the following formula.

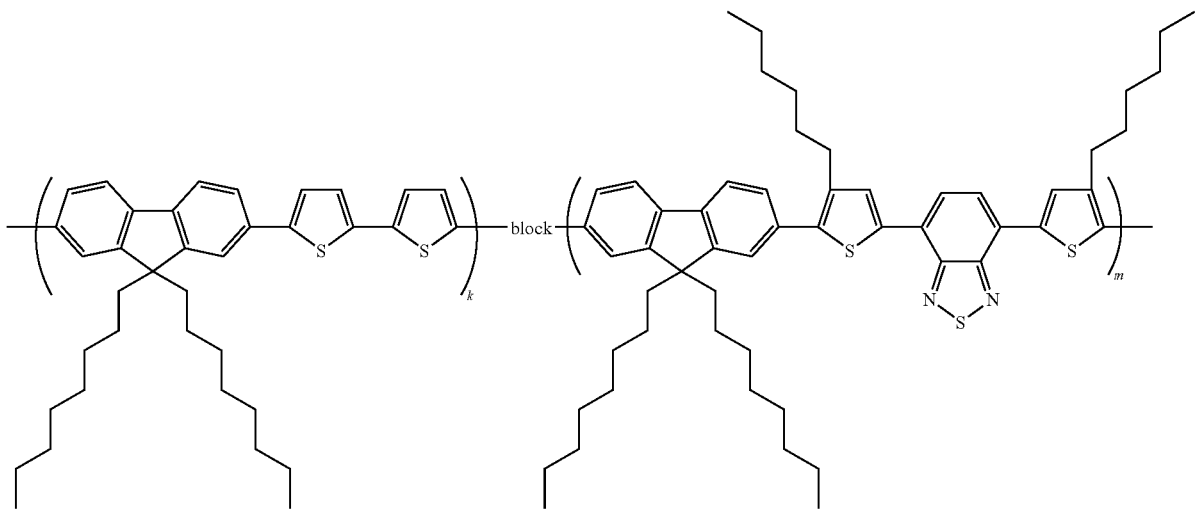

Synthesis Example 2

Synthesis of Polymer Compound 2

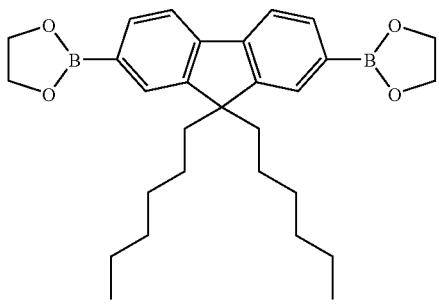
(I)

In a 2 L four-necked flask, in which an atmosphere was replaced with argon, a compound (I) (7.928 g, 16.72 mmol), a compound (J) (13.00 g, 17.60 mmol), methyltrioctylammonium chloride (trade name: aliquat336, manufactured by Aldrich, $CH_3N[(CH_2)_7CH_3]_3Cl$, density of 0.884 g/ml, 25° C., trademark of Henkel Corporation) (4.979 g) and 405 ml of toluene were charged, and the inside of the system was degassed by bubbling an argon gas for 30 minutes while stirring.

Dichlorobis(triphenylphosphine) palladium(II) (0.02 g) was added and, after heating to 105° C., 42.2 ml of an aqueous sodium carbonate solution (2 mol/L) was added dropwise while stirring. After completion of the dropwise addition, the reaction was carried out for 5 hours, and phenylboric acid (2.6 g) and 1.8 ml of toluene were added, followed by stirring at 105° C. for 16 hours. Toluene (700 ml) and 200 ml of a 7.5% aqueous sodium diethyldithiocarbamate trihydrate solution were added, followed by stirring at 85° C. for 3 hours. After removing the aqueous layer, the residue was washed twice with 300 ml of ion-exchange water at 60° C., washed once with 300 ml of 3% acetic acid at 60° C. and then washed three times with 300 ml of ion-exchange water at 60° C. The organic layer was passed through a column packed with celite, alumina and silica and then washed with 800 ml of hot toluene. The solution was concentrated to 700 ml and poured into 2 L of methanol thereby to reprecipitate a polymer. The polymer was recovered by filtration and then washed in turn with 500 ml of methanol, acetone and methanol. The polymer was vacuum-dried at 50° C. overnight to obtain 12.21 g of a pentathienyl-fluorene copolymer (hereinafter referred to as a "polymer compound 2") represented by the following formula:

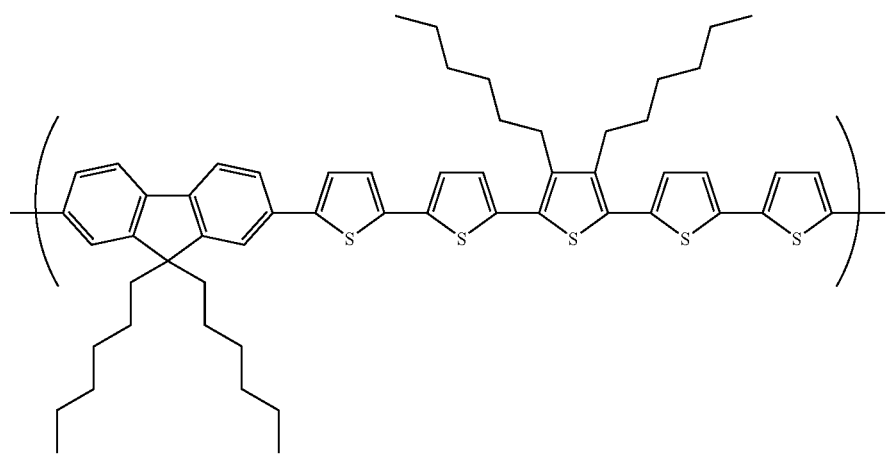

-continued

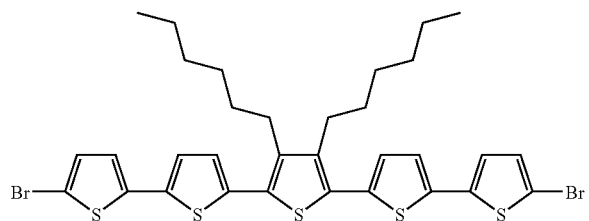
(J)

The polymer compound 2 had a number average molecular weight of $5.4 \times 10^4$ and a weight average molecular weight of $1.1 \times 10^5$ in terms of polystyrene.

Synthesis Example 3

Synthesis of Polymer Compound 3

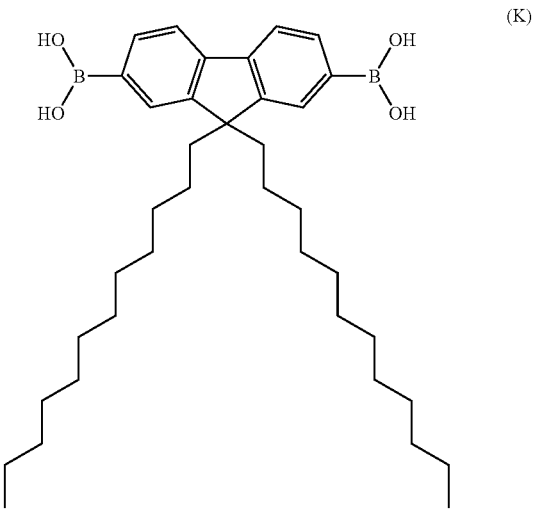
(K)

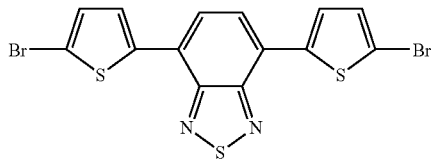
(L)

A compound (K) (0.529 g), 0.458 g of a compound (L), 0.50 g of methyltrioctylammonium chloride (trade name: aliquat 336, manufactured by Aldrich, $CH_3N[(CH_2)_7CH_3]_3Cl$, density of 0.884 g/ml, 25° C., trademark of Henkel Corporation), 3.9 mg of palladium(II) acetate and 22.5 mg of tris(2-methoxyphenyl)phosphine were charged in a reaction vessel and the atmosphere inside the reaction vessel was sufficiently replaced with an argon gas. In the reaction vessel, 30 ml of toluene degassed by bubbling an argon gas in advance was added. To the solution, 5 ml of a 16.7% by weight aqueous sodium carbonate solution degassed by bubbling an argon gas in advance was added dropwise and, after heating to the temperature at which the solvent is refluxed, reflux was carried out for 3 hours. The reaction was carried out under an argon gas atmosphere.

Next, the resultant reaction solution was cooled to around room temperature, and then a solution (S1) described below prepared in a separate vessel (replaced with an argon gas) was added to the reaction solution.

[Preparation of Solution (S1)]

The compound (C) (0.535 g), 0.293 g of the compound (E), 2.9 mg of palladium(II) acetate and 13.8 mg of tris(2-methoxyphenyl)phosphine were charged in a vessel and the atmosphere inside the vessel was sufficiently replaced with an argon gas. In the vessel, 30 ml of toluene degassed by bubbling an argon gas in advance was added to obtain a solution (S1).

To the reaction solution obtained by adding the solution (S1), 5 ml of a 16.7% by weight aqueous sodium carbonate solution degassed by bubbling an argon gas in advance was added dropwise and, after heating to the temperature at which the solvent is refluxed, reflux was carried out for 3 hours. The reaction was carried out under an argon gas atmosphere.

After cooling the resultant reaction solution, a mixed solution of 0.30 g of phenylboric acid and 1.0 ml of tetrahydrofuran was added to the reaction solution, followed by reflux for 1 hour. The reaction was carried out under an argon gas atmosphere.

After the completion of the reaction, the resultant reaction solution was cooled and the reaction solution was allowed to stand, and then the separated toluene layer was recovered. Next, the resultant toluene layer was poured into methanol thereby to perform reprecipitation, and the resultant precipitate was recovered. The precipitate was dried under reduced pressure and then dissolved in chloroform. Next, the resultant chloroform solution was filtered to remove insolubles and the chloroform solution was purified by passing through an alumina column. Next, the resultant chloroform solution was concentrated under reduced pressure and poured into methanol thereby to perform precipitate, and the resultant precipitate was recovered. The precipitate was washed with methanol and then dried under reduced pressure to obtain 0.87 g of a polymer compound 3. The polymer compound 3 had a weight average molecular weight of $8.3 \times 10^4$ and a number average molecular weight of $2.4 \times 10^4$ in terms of polystyrene.

The polymer compound 3 has a block composed of a repeating unit represented by the formula (M):

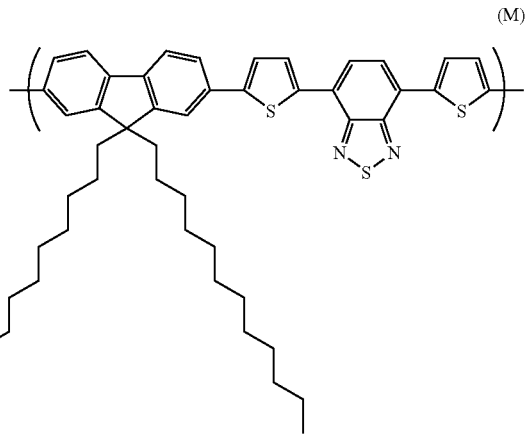
(M)

and a block composed of a repeating unit represented by the formula (F):

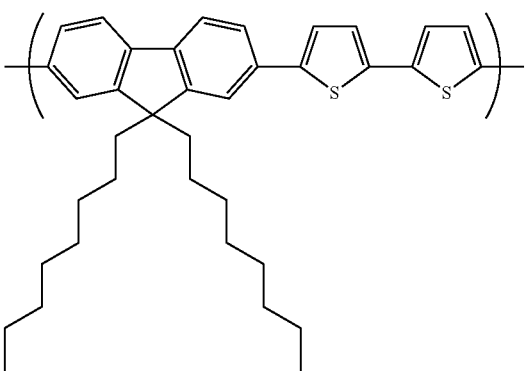
(F)

and is represented by the following formula:

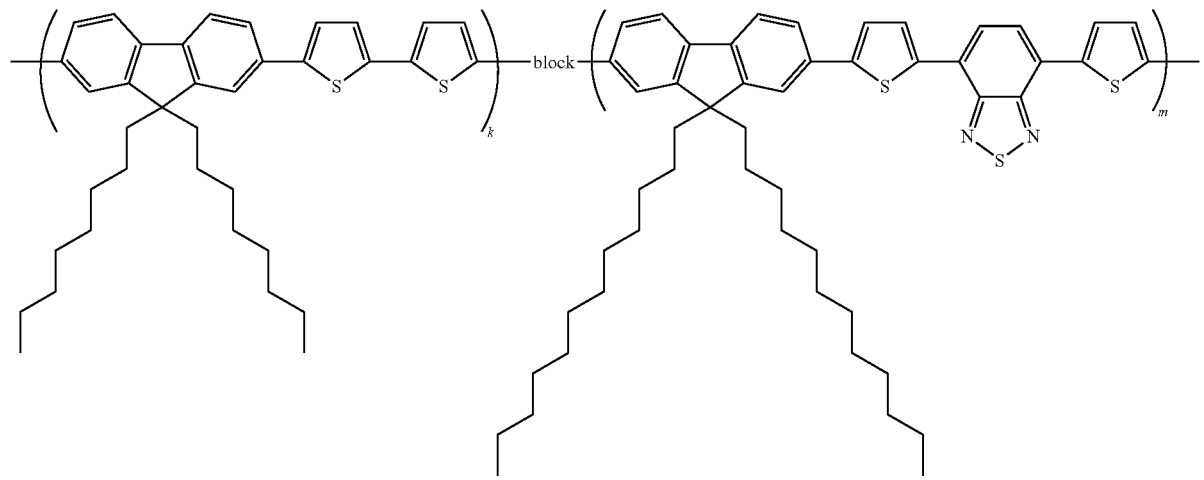

Synthesis Example 4

Synthesis of Polymer Compound 4

The compound (K) (0.945 g), 0.916 g of the compound (L), 0.45 g of methyltrioctylammonium chloride (trade name: aliquat 336, manufactured by Aldrich, $CH_3N[(CH_2)_7CH_3]_3Cl$, density of 0.884 g/ml, 25° C., trademark of Henkel Corporation), 4.9 mg of palladium(II) acetate and 25.1 mg of tris(2-methoxyphenyl)phosphine were charged in a reaction vessel and the atmosphere inside the reaction vessel was sufficiently replaced with an argon gas. In the reaction vessel, 40 ml of toluene degassed by bubbling an argon gas in advance was added. Next, 10 ml of a 16.7% by weight aqueous sodium carbonate solution degassed by bubbling an argon gas in advance was added dropwise to the solution and, after heating to the temperature at which the solvent is refluxed, reflux was carried out for 3.5 hours. The reaction was carried out under an argon gas atmosphere.

After cooling the reaction solution to around 50° C., a mixed solution of 0.27 g of phenylboric acid and 1 ml of tetrahydrofuran was added to the reaction solution, followed by heating and further reflux for 9 hours. The reaction was carried out under an argon gas atmosphere.

After completion of the reaction, the reaction solution was cooled to around room temperature and 25 ml of toluene was added to the reaction solution. The resultant reaction solution was allowed to stand and the separated toluene layer was recovered. Next, the resultant toluene layer was poured into methanol thereby to perform reprecipitation and the resultant precipitate was recovered. The precipitate was dried under reduced pressure and then dissolved in chloroform. The resultant chloroform solution was filtered to remove insolubles and then purified by passing through an alumina column. Next, the resultant chloroform solution was poured into methanol thereby to perform reprecipitation and the resultant precipitate was recovered. The precipitate was washed with methanol and dried under reduced pressure to obtain 0.80 g of a polymer compound 4 composed of a repeating unit represented by the following formula:

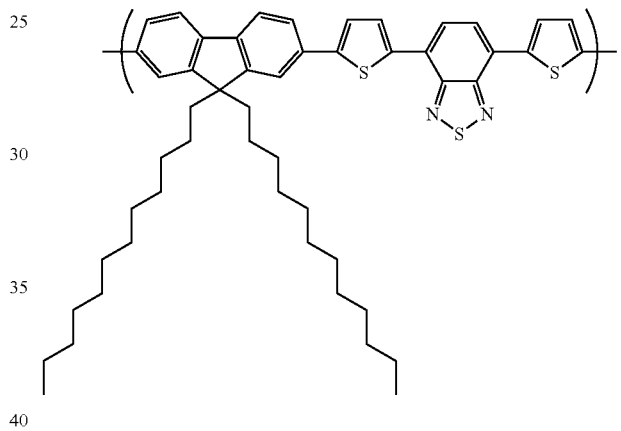

The polymer compound 4 had a weight average molecular weight of $1.9 \times 10^4$ and a number average molecular weight of $7.3 \times 10^3$ in terms of polystyrene.

Example 1

Production of Composition 1

A composition 1 was produced by mixing 10 mg of the polymer compound 1 with 10 mg of the polymer compound 2. A weight ratio of the polymer compound 1 to the polymer compound 2 contained in the composition 1 was 50:50.

Example 2

Production of Composition 2

A composition 2 was produced by dissolving 10 mg of the composition 1 in 1.99 g of o-dichlorobenzene. The content of the composition 1 in the composition 2 was 0.5% by weight.

Example 3

Production of Composition 3

In 1.5 g of the composition 2, 22.5 mg of C60PCBM (Phenyl C61-butyric acid methyl ester, manufactured by Frontier Carbon Corporation under the trade name of E100, rot name of 7B0217-A) as an electron acceptor was dissolved to produce a composition 3. In the composition 3, a weight ratio of the total of the polymer compound 1 and the polymer compound 2 to C60PCBM was 25:75.

Example 4

Production of Composition 4

In 1.5 g of the composition 2, 22.5 mg of C70PCBM (Phenyl C71-butyric acid methyl ester, manufactured by American Dye Source Inc. under the trade name of ADS71BFA, lot name of 07L022E) as an electron acceptor was dissolved. Next, 15 mg (1% by weight based on the weight of the solution) of silica gel (Wakogel C-300 (particle size of 45 to 75 μm), manufactured by Wako Pure Chemical Industries, Ltd.) was added, followed by stirring at 23° C. for 12 hours. After completion of stirring, silica gel in the solution was removed by filtering using a Teflon (registered trademark) filter having a pore diameter of 1.0 μm to produce a composition 4. In the composition 4, a weight ratio of the total of the polymer compound 1 and the polymer compound 2 to C70PCBM was 25:75.

Example 5

Production of Composition 5

A composition 5 was produced by mixing 15 mg of the polymer compound 1 with 5 mg of the polymer compound 2. A weight ratio of the polymer compound 1 to the polymer compound 2 contained in the composition 5 was 75:25.

Example 6

Production of Composition 6

A composition 6 was produced by dissolving 10 mg of the composition 5 and 1.99 g of o-dichlorobenzene. The content of the composition 5 in the composition 6 was 0.5% by weight.

Example 7

Production of Composition 7

In 1.5 g of the composition 6, 22.5 mg of C70PCBM (Phenyl C71-butyric acid methyl ester, manufactured by American Dye Source Inc. under the trade name of ADS71BFA, lot name of 07L022E) as an electron acceptor was dissolved. Next, 15 mg (1% by weight based on the weight of the solution) of silica gel (Wakogel C-300 (particle size of 45 to 75 μm), manufactured by Wako Pure Chemical Industries, Ltd.) was added, followed by stirring at 23° C. for 12 hours. After completion of stirring, silica gel in the solution was removed by filtering using a Teflon (registered trademark) filter having a pore diameter of 1.0 μm to produce a composition 7. In the composition 7, a weight ratio of the total of the polymer compound 1 and the polymer compound 2 to C70PCBM was 25:75.

Comparative Example 1

Production of Composition 8

A composition 8 was produced by dissolving 10 mg of the polymer compound 1 and 1.99 g of o-dichlorobenzene. The content of the polymer compound 1 in the composition 8 was 0.5% by weight.

Comparative Example 2

Production of Composition 9

In 1.5 g of the composition 8, 22.5 mg of C60PCBM (Phenyl C61-butyric acid methyl ester, manufactured by Frontier Carbon Corporation under the trade name of E100, lot name of 7B0217-A) as an electron acceptor was dissolved to produce a composition 9. In the composition 9, a weight ratio of the polymer compound 1 to C60PCBM was 25:75.

Comparative Example 3

Production of Composition 10

In 1.5 g of the composition 8, 22.5 mg of C70PCBM (Phenyl C71-butyric acid methyl ester, manufactured by American Dye Source Inc. under the trade name of ADS71BFA, lot name of 07L022E) as an electron acceptor was dissolved. Next, 15 mg (1% by weight based on the weight of the solution) of silica gel (Wakogel C-300 (particle size of 45 to 75 μm), manufactured by Wako Pure Chemical Industries, Ltd.) was added, followed by stirring at 23° C. for 12 hours. After completion of stirring, silica gel in the solution was removed by filtering using a Teflon (registered trademark) filter of 1.0 μm to produce a composition 10. In the composition 10, a weight ratio of the polymer compound 1 to C70PCBM was 25:75.

Comparative Example 4

Production of Composition 11

A composition 11 was produced by dissolving 10 mg of the polymer compound 2 in 1.99 g of o-dichlorobenzene. The content of the polymer compound 2 in the composition 11 was 0.5% by weight.

Comparative Example 5

Production of Composition 12

In 1.5 g of the composition 11, 22.5 mg of C60PCBM (Phenyl C61-butyric acid methyl ester, manufactured by Frontier Carbon Corporation under the trade name of E100, lot name of 7B0217-A) as an electron acceptor was dissolved to produce a composition 12. In the composition 12, a weight ratio of the polymer compound 2 to C60PCBM was 25:75.

Comparative Example 6

Production of Composition 13

In 1.5 g of the composition 11, 22.5 mg of C70PCBM (Phenyl C71-butyric acid methyl ester, manufactured by American Dye Source Inc. under the trade name of ADS71BFA, lot name of 07L022E) as an electron acceptor was dissolved. Next, 15 mg (1% by weight based on the weight of the solution) of silica gel (Wakogel C-300 (particle size of 45 to 75 μm), manufactured by Wako Pure Chemical Industries, Ltd.) was added, followed by stirring at 23° C. for 12 hours. After completion of stirring, silica gel in the solution was removed by filtering using a Teflon (registered trademark) filter of 1.0 μm to produce a composition 13. In the composition 13, a weight ratio of the polymer compound 2 to C70PCBM was 25:75.

Example 8

Production and Evaluation of Organic Thin Film Solar Battery

A glass substrate with an ITO film having a thickness of 150 nm was subjected to a surface treatment by an ozone UV treatment using a sputtering method. Next, the composition 3 was applied thereto by spin coating to obtain an active layer (film thickness of about 100 nm) of an organic thin film solar battery. Thereafter, lithium fluoride was vapor-deposited in a film thickness of 4 nm by a vacuum deposition apparatus and then Al was vapor-deposited in a film thickness of 100 nm. The vacuum degree during vapor deposition was entirely 1 to $9\times10^{-3}$ Pa. The resultant organic thin film solar battery had a regular square measuring 2 mm×2 mm. The resultant organic thin film solar battery was irradiated with constant light using a solar simulator (manufactured by BUNKOUKEIKI Co., Ltd. under the trade name of OTENTO-SUNII: AM1.5G filter, irradiance of 100 mW/cm$^2$) and then photoelectric conversion efficiency was determined by measuring the electric current and voltage generated. The measurement result is shown in Table 1.

Example 9

Production and Evaluation of Organic Thin Film Solar Battery

In the same manner as in Example 8, except that the composition 4 was used in place of the composition 3, photoelectric conversion efficiency of an organic thin film solar battery was measured. The measurement result is shown in Table 1.

Example 10

Production and Evaluation of Organic Thin Film Solar Battery

In the same manner as in Example 8, except that the composition 7 was used in place of the composition 3, photoelectric conversion efficiency of an organic thin film solar battery was measured. The measurement result is shown in Table 1.

Comparative Example 7

Production and Evaluation of Organic Thin Film Solar Battery

In the same manner as in Example 8, except that the composition 9 was used in place of the composition 3, photoelectric conversion efficiency of an organic thin film solar battery was measured. The measurement result is shown in Table 1.

Comparative Example 8

Production and Evaluation of Organic Thin Film Solar Battery

In the same manner as in Example 8, except that the composition 10 was used in place of the composition 3, photoelectric conversion efficiency of an organic thin film solar battery was measured. The measurement result is shown in Table 1.

Comparative Example 9

Production and Evaluation of Organic Thin Film Solar Battery

In the same manner as in Example 8, except that the composition 12 was used in place of the composition 3, photoelectric conversion efficiency of an organic thin film solar battery was measured. The measurement result is shown in Table 1.

Comparative Example 10

Production and Evaluation of Organic Thin Film Solar Battery

In the same manner as in Example 8, except that the composition 13 was used in place of the composition 3, photoelectric conversion efficiency of an organic thin film solar battery was measured. The measurement result is shown in Table 1.

Example 11

Production of Composition 20

A composition 20 was produced by mixing 10 mg of the polymer compound 3 with 10 mg of the polymer compound 2. A weight ratio of the polymer compound 3 to the polymer compound 2 contained in the composition 20 was 50:50.

Example 12

Production of Composition 21

A composition 21 was produced by dissolving 10 mg of the polymer composition 20 in 1.99 g of o-dichlorobenzene. The content of the composition 20 in the composition 21 was 0.5% by weight.

Example 13

Production of Composition 22

A composition 22 was produced by mixing 10 mg of the polymer compound 4 with 10 mg of the polymer compound 2. A weight ratio of the polymer compound 4 to the polymer compound 2 contained in the composition 22 was 50:50.

Example 14

Production of Composition 23

A composition 23 was produced by dissolving 10 mg of the polymer composition 22 in 1.99 g of o-dichlorobenzene. The content of the composition 22 in the composition 23 was 0.5% by weight.

Example 15

Production of Composition 24

In 1.5 g of the composition 21, 22.5 mg of C70PCBM (Phenyl C71-butyric acid methyl ester, manufactured by American Dye Source Inc. under the trade name of ADS71BFA, lot name of 08C059E) as an electron acceptor was dissolved. Next, 15 mg (1% by weight based on the weight of the solution) of silica gel (Wakogel C-300 (particle size of 45 to 75 µm), manufactured by Wako Pure Chemical Industries, Ltd.) was added, followed by stirring at 23° C. for 12 hours. After completion of stirring, silica gel in the solution was removed by filtering using a Teflon (registered trademark) filter having a pore diameter of 1.0 µm to produce a composition 24. In the composition 24, a weight ratio of the total of the polymer compound 3 and the polymer compound 2 to C70PCBM was 25:75.

Example 16

Production of Composition 25

In 1.5 g of the composition 23, 22.5 mg of C70PCBM (Phenyl C71-butyric acid methyl ester, manufactured by American Dye Source Inc. under the trade name of ADS71BFA, lot name of 08C059E) as an electron acceptor was dissolved. Next, 15 mg (1% by weight based on the weight of the solution) of silica gel (Wakogel C-300 (particle size of 45 to 75 µm), manufactured by Wako Pure Chemical Industries, Ltd.) was added, followed by stirring at 23° C. for 12 hours. After completion of stirring, silica gel in the solution was removed by filtering using a Teflon (registered trademark) filter having a pore diameter of 1.0 µm to produce a composition 25. In the composition 25, a weight ratio of the total of the polymer compound 4 and the polymer compound 2 to C70PCBM was 25:75.

Example 17

Production and Evaluation of Organic Thin Film Solar Battery

In the same manner as in Example 8, except that the composition 24 was used in place of the composition 3, photoelectric conversion efficiency of an organic thin film solar battery was measured. The measurement result is shown in Table 1.

Example 18

Production and Evaluation of Organic Thin Film Solar Battery

In the same manner as in Example 8, except that the composition 25 was used in place of the composition 3, photoelectric conversion efficiency of an organic thin film solar battery was measured. The measurement result is shown in Table 1.

Comparative Example 11

Production of Composition 15

A composition 15 was produced by dissolving 10 mg of the polymer compound 3 in 1.99 g of o-dichlorobenzene. The content of the polymer compound 3 in the composition 15 was 0.5% by weight.

Comparative Example 12

Production of Composition 16

A composition 16 was produced by dissolving 10 mg of the polymer compound 4 in 1.99 g of o-dichlorobenzene. The content of the polymer compound 4 in the composition 16 was 0.5% by weight.

Comparative Example 13

Production of Composition 17

In 1.5 g of the composition 11, 22.5 mg of C70PCBM (Phenyl C71-butyric acid methyl ester, manufactured by American Dye Source Inc. under the trade name of ADS71BFA, lot name of 08C059E) as an electron acceptor was dissolved. Next, 15 mg (1% by weight based on the weight of the solution) of silica gel (Wakogel C-300 (particle size of 45 to 75 µm), manufactured by Wako Pure Chemical Industries, Ltd.) was added, followed by stirring at 23° C. for 12 hours. After completion of stirring, silica gel in the solution was removed by filtering using a Teflon (registered trademark) filter having a pore diameter of 1.0 µm to produce a composition 17. In the composition 17, a weight ratio of the polymer compound 2 to C70PCBM was 25:75.

Comparative Example 14

Production of Composition 18

In 1.5 g of the composition 15, 22.5 mg of C70PCBM (Phenyl C71-butyric acid methyl ester, manufactured by American Dye Source Inc. under the trade name of ADS71BFA, lot name of 08C059E) as an electron acceptor was dissolved. Next, 15 mg (1% by weight based on the weight of the solution) of silica gel (Wakogel C-300 (particle size of 45 to 75 µm), manufactured by Wako Pure Chemical Industries, Ltd.) was added, followed by stirring at 23° C. for 12 hours. After completion of stirring, silica gel in the solution was removed by filtering using a Teflon (registered trademark) filter having a pore diameter of 1.0 µm to produce a composition 18. In the composition 18, a weight ratio of the polymer compound 3 to C70PCBM was 25:75.

Comparative Example 15

Production of Composition 19

In 1.5 g of the composition 16, 22.5 mg of C70PCBM (Phenyl C71-butyric acid methyl ester, manufactured by American Dye Source Inc. under the trade name of ADS71BFA, lot name of 08C059E) as an electron acceptor was dissolved. Next, 15 mg (1% by weight based on the weight of the solution) of silica gel (Wakogel C-300 (particle size of 45 to 75 µm), manufactured by Wako Pure Chemical Industries, Ltd.) was added, followed by stirring at 23° C. for 12 hours. After completion of stirring, silica gel in the solution was removed by filtering using a Teflon (registered trademark) filter having a pore diameter of 1.0 µm to produce a composition 19. In the composition 19, a weight ratio of the polymer compound 2 to C70PCBM was 25:75.

Comparative Example 16

Production and Evaluation of Organic Thin Film Solar Battery

In the same manner as in Example 8, except that the composition 17 was used in place of the composition 3, photoelectric conversion efficiency of an organic thin film solar battery was measured. The measurement result is shown in Table 1.

Comparative Example 17

Production and Evaluation of Organic Thin Film Solar Battery

In the same manner as in Example 8, except that the composition 18 was used in place of the composition 3, photoelectric conversion efficiency of an organic thin film solar battery was measured. The measurement result is shown in Table 1.

Comparative Example 18

Production and Evaluation of Organic Thin Film Solar Battery

In the same manner as in Example 8, except that the composition 19 was used in place of the composition 3, photoelectric conversion efficiency of an organic thin film solar battery was measured. The measurement result is shown in Table 1.

—Evaluation—

As is apparent from Table 1, organic thin film solar batteries (Examples 8 to 10, 17, 18) produced by using a composition containing at least one polymer compound selected from the group consisting of the polymer compound 1, the polymer compound 3 and the polymer compound 4, which contains a repeating unit represented by the formula (1), and the polymer compound 2 containing a repeating unit represented by the formula (2) exhibit high photoelectric conversion efficiency when compared with organic thin film solar batteries (Comparative Examples 7 to 13) produced using a polymer compound alone.

INDUSTRIAL APPLICABILITY

Since it is possible to produce an organic photoelectric converter, which exhibits excellent photoelectric conversion efficiency, by using the composition of the present invention, the present invention is extremely useful from an industrial point of view.

The invention claimed is:

1. A composition comprising a polymer compound A containing a repeating unit represented by the formula (1) and a polymer compound B containing a repeating unit represented by the formula (2):

TABLE 1

| | Composition | Polymer compound | Fullerene | Photoelectric conversion efficiency (%) |
|---|---|---|---|---|
| Example 8 | Composition 3 | Polymer compound 1/Polymer compound 2 = 50/50 | C60PCBM | 3.4 |
| Comparative Example 7 | Composition 9 | Polymer compound 1 | C60PCBM | 3.0 |
| Comparative Example 9 | Composition 12 | Polymer compound 2 | C60PCBM | 3.1 |
| Example 9 | Composition 4 | Polymer compound 1/Polymer compound 2 = 50/50 | C70PCBM (Lot name 07L022E) | 5.3 |
| Example 10 | Composition 7 | Polymer compound 1/Polymer compound 2 = 75/25 | C70PCBM (Lot name 07L022E) | 5.0 |
| Comparative Example 8 | Composition 10 | Polymer compound 1 | C70PCBM (Lot name 07L022E) | 4.4 |
| Comparative Example 10 | Composition 13 | Polymer compound 2 | C70PCBM (Lot name 07L022E) | 4.6 |
| Example 17 | Composition 24 | Polymer compound 3/Polymer compound 2 = 50/50 | C70PCBM (Lot name 08C059E) | 4.7 |
| Example 18 | Composition 25 | Polymer compound 4/Polymer compound 2 = 50/50 | C70PCBM (Lot name 08C059E) | 4.4 |
| Comparative Example 16 | Composition 17 | Polymer compound 2 | C70PCBM (Lot name 08C059E) | 4.3 |
| Comparative Example 17 | Composition 18 | Polymer compound 3 | C70PCBM (Lot name 08C059E) | 1.9 |
| Comparative Example 18 | Composition 19 | Polymer compound 4 | C70PCBM (Lot name 08C0 | 3.9 |

(1)

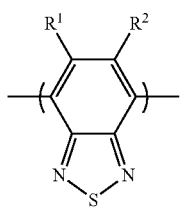

wherein $R^1$ and $R^2$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and the hydrogen atom contained in these groups may be substituted with a fluorine atom, and (2)

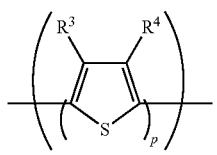

wherein $R^3$ and $R^4$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and the hydrogen atom contained in these groups may be substituted with a fluorine atom; p represents an integer of 2 to 10; a plurality of $R^3$(s) may be the same or different; and a plurality of $R^4$(s) may be the same or different, wherein the polymer compound A includes a block containing one or more repeating units selected from a repeating unit represented by the formula (12), a repeating unit represented by the formula (13) and a repeating unit represented by the formula (14):

(12)

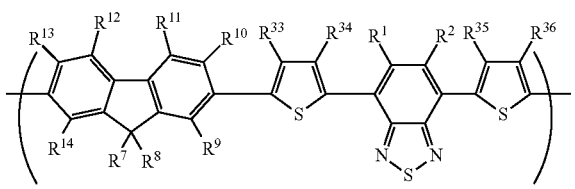

wherein $R^1$ and $R^2$ have the same meanings as defined above, and wherein $R^7$, $R^8$, $R^9$, $R^{10}$, $R^{11}$, $R^{12}$, $R^{13}$ and $R^{14}$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and the hydrogen atom contained in these groups may be substituted with a fluorine atom, and $R^{33}$, $R^{34}$, $R^{35}$ and $R^{36}$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group;

(13)

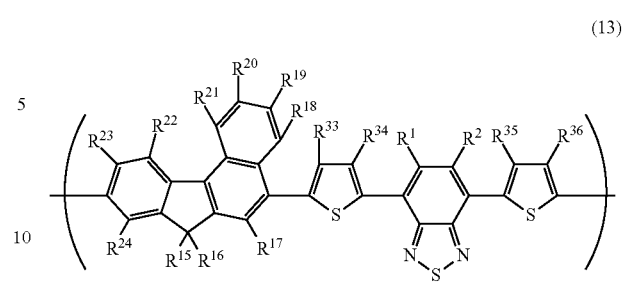

wherein $R^1$, $R^2$, $R^{33}$, $R^{34}$, $R^{35}$ and $R^{36}$ have the same meanings as defined above, and wherein $R^{15}$, $R^{16}$, $R^{17}$, $R^{18}$, $R^{19}$, $R^{20}$, $R^{21}$, $R^{22}$, $R^{23}$ and $R^{24}$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and the hydrogen atom contained in these groups may be substituted with a fluorine atom;

(14)

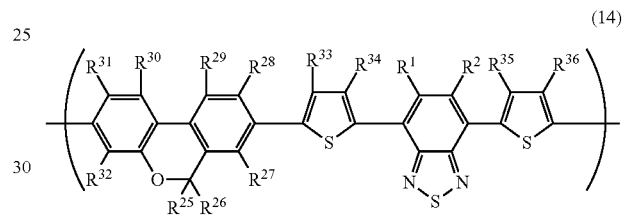

wherein $R^1$, $R^2$, $R^{33}$, $R^{34}$, $R^{35}$ and $R^{36}$ have the same meanings as defined above, and wherein $R^{25}$, $R^{26}$, $R^{27}$, $R^{28}$, $R^{29}$, $R^{30}$, $R^{31}$ and $R^{32}$ each independently represent a hydrogen atom, a fluorine atom, an alkyl group, an alkoxy group, an alkylthio group, an aryl group, an aryloxy group, an arylthio group, an arylalkyl group, an arylalkoxy group or an arylalkylthio group, and the hydrogen atom contained in these groups may be substituted with a fluorine atom.

2. The composition according to claim 1, wherein the polymer compound B further contains a repeating unit represented by the formula (4):

(4)

wherein Ar represents an arylene group, a divalent heterocyclic group or a divalent aromatic amine residue.

3. The composition according to claim 1, wherein p is an integer of 2 to 7.

4. The composition according to claim 1, wherein the formula (2) is a repeating unit represented by the formula (11):

(11)

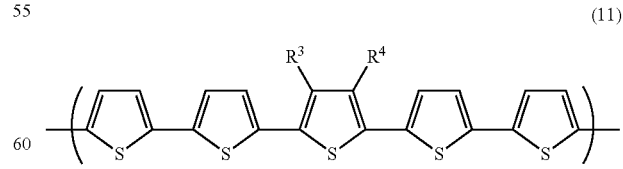

wherein $R^3$ and $R^4$ have the same meanings as defined above.

5. The composition according to claim 1, wherein the weight of the polymer compound A is from 1 to 99 when the weight of the composition is 100.

6. The composition according to claim 1, further comprising an electron-accepting compound.

7. The composition according to claim 6, wherein the electron-accepting compound is a fullerene derivative.

8. The composition according to claim 1, further comprising an electron-donating compound.

9. The composition according to claim 1, further comprising a solvent.

10. An organic photoelectric converter comprising an organic layer containing the composition according to claim 1.

11. An organic photoelectric converter comprising a pair of electrodes, at least one of which is transparent or translucent; a first organic layer containing the composition according to claim 1 provided between the electrodes; and a second organic layer containing an electron-donating compound provided adjacent to the first organic layer.

12. An organic photoelectric converter comprising a pair of electrodes, at least one of which is transparent or translucent; a first organic layer containing an electron-accepting compound provided between the electrodes; and a second organic layer containing the composition according to claim 1 provided adjacent to the first organic layer.

13. An organic photoelectric converter comprising a pair of electrodes, at least one of which is transparent or translucent; and an organic layer containing the composition according to claim 6 provided between the electrodes.

14. An organic photoelectric converter comprising a pair of electrodes, at least one of which is transparent or translucent; and an organic layer containing the composition according to claim 8 provided between the electrodes.

* * * * *